US009929316B2

(12) United States Patent
Emura et al.

(10) Patent No.: US 9,929,316 B2
(45) Date of Patent: Mar. 27, 2018

(54) LIGHT EMITTING ELEMENT

(71) Applicant: NICHIA CORPORATION, Anan-shi, Tokushima (JP)

(72) Inventors: Keiji Emura, Anan (JP); Yoshiki Inoue, Anan (JP); Takamasa Sunda, Tokushima (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 15/388,507

(22) Filed: Dec. 22, 2016

(65) Prior Publication Data
US 2017/0186915 A1 Jun. 29, 2017

(30) Foreign Application Priority Data

Dec. 25, 2015 (JP) .................................. 2015-254098
Jun. 30, 2016 (JP) .................................. 2016-131024

(51) Int. Cl.
*H01L 33/00* (2010.01)
*H01L 33/40* (2010.01)
*H01L 27/15* (2006.01)
*H01L 33/46* (2010.01)
*H01L 33/62* (2010.01)
(Continued)

(52) U.S. Cl.
CPC .......... *H01L 33/405* (2013.01); *H01L 27/156* (2013.01); *H01L 33/46* (2013.01); *H01L 33/62* (2013.01); *H01L 33/382* (2013.01); *H01L 33/44* (2013.01)

(58) Field of Classification Search
CPC ..... H01L 33/405; H01L 27/156; H01L 33/46; H01L 33/62
See application file for complete search history.

(56) References Cited

U.S. PATENT DOCUMENTS

| 2011/0204387 A1 | 8/2011 | Kim et al. |
| 2012/0091478 A1 | 4/2012 | Lee et al. |
| 2015/0200230 A1 | 7/2015 | Jang et al. |

FOREIGN PATENT DOCUMENTS

| JP | 2010-062592 A | 3/2010 |
| JP | 2011-171739 A | 9/2011 |
| JP | 2012-204373 A | 10/2012 |

(Continued)

OTHER PUBLICATIONS

Extended European Search Report dated Mar. 22, 2017 in European Patent Application No. 16206387.9.

*Primary Examiner* — Victor A Mandala
*Assistant Examiner* — Colleen E Snow
(74) *Attorney, Agent, or Firm* — Foley & Lardner LLP

(57) ABSTRACT

A light emitting element includes a substrate; a plurality of semiconductor light emitting cells; a plurality of light reflective electrodes; a first insulation layer that continuously covers lateral surfaces of the semiconductor light emitting cells, spaces between the semiconductor light emitting cells, lateral surfaces of the light reflective electrodes, and a portion of upper surfaces of the light reflective electrodes; a plurality of wiring electrodes, and cover the lateral surfaces of the semiconductor light emitting cells and the spaces between the semiconductor light emitting cells via the first insulation layer; and a light reflective metal layer that covers the lateral surfaces of at least two adjacent ones of the semiconductor light emitting cells and the space between said at least two semiconductor light emitting cells, via the first insulation layer.

20 Claims, 21 Drawing Sheets

(51) Int. Cl.
    *H01L 33/38*     (2010.01)
    *H01L 33/44*     (2010.01)

(56) References Cited

FOREIGN PATENT DOCUMENTS

| KR | 10-2008-0002161 A | 1/2008 |
| WO | WO-2010/074288 A1 | 7/2010 |
| WO | WO-2011/093405 A1 | 8/2011 |
| WO | WO-2011/108664 A1 | 9/2011 |

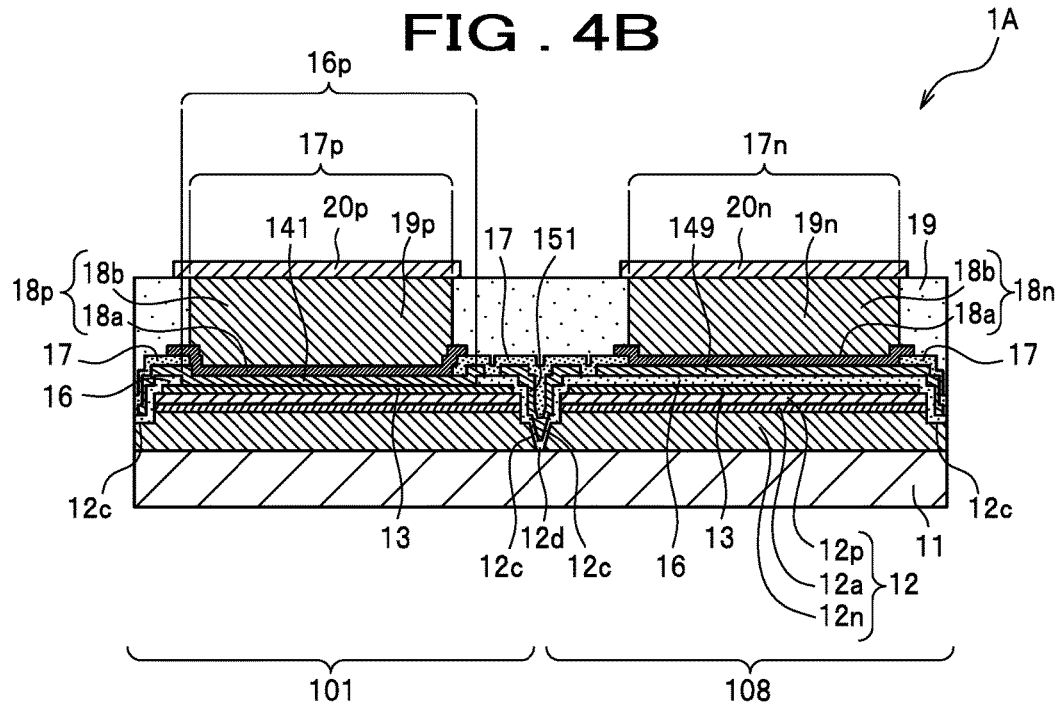
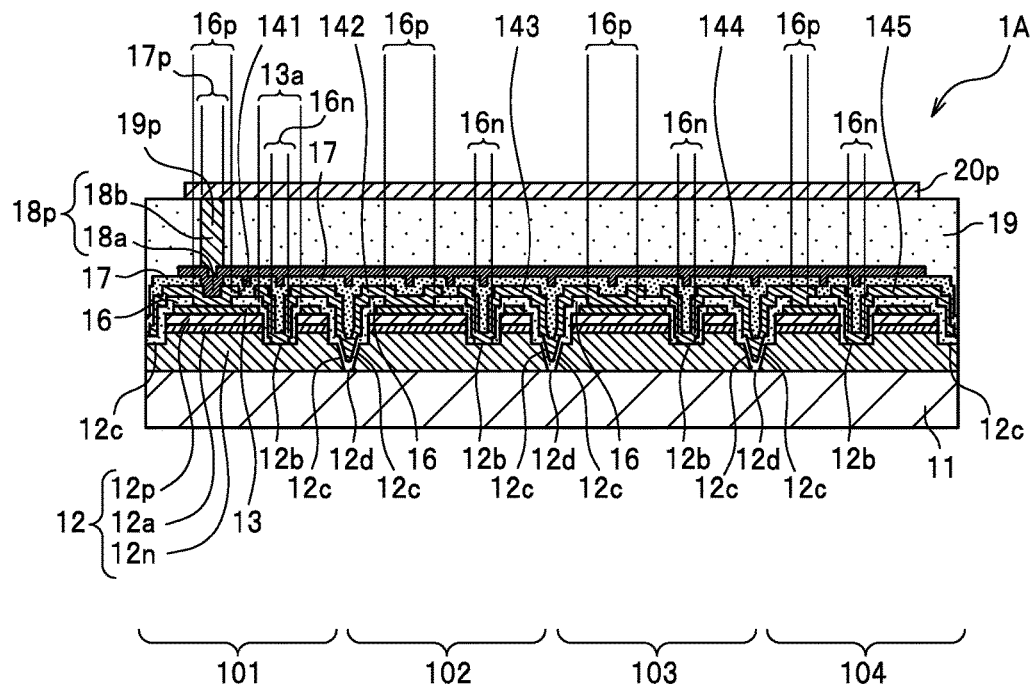

LIGHT EMITTING ELEMENT

CROSS-REFERENCE TO RELATED APPLICATIONS

This application claims priority to Japanese Patent Application No. 2015-254098, filed on Dec. 25, 2015 and Japanese Patent Application No. 2016-131024, filed on Jun. 30, 2016, the disclosures of which are hereby incorporated by reference in their entireties.

BACKGROUND

The present disclosure relates to light emitting elements.

Monolithic light emitting elements in which the semiconductor layer formed on a single substrate is divided into a plurality of light emitting cells by disposing grooves and providing wiring between the plurality of cells have been proposed. Japanese Unexamined Patent Application Publication No. 2010-62592 discloses a light emitting element having a plurality of light emitting cells formed on a single substrate, and is flip chip mounted on a submount board as shown in FIG. 6.

SUMMARY

It is difficult for the light emitting element disclosed in the above referenced patent document to achieve a high light extraction efficiency because the light emitted from the lateral surfaces of the light emitting cells can be absorbed or become incident on the adjacent light emitting cells. When the plurality of light emitting cells in these light emitting elements are connected in series, moreover, potential differences occur between the light emitting cells. For this reason, it is likely to cause migration of the metal materials, such as Ag, used for the electrodes.

An object of the present disclosure is to provide a light emitting element with an improved light extraction efficiency while reducing migration of metal materials used for electrodes.

The light emitting element according to the present invention includes a substrate; a plurality of semiconductor light emitting cells disposed on an upper surface side of the substrate; a plurality of light reflective electrodes disposed on each of upper surfaces of the plurality of semiconductor light emitting cells; a first insulation layer that continuously covers lateral surfaces of the semiconductor light emitting cells, spaces between the semiconductor light emitting cells, lateral surfaces of the light reflective electrodes, and a portion of upper surfaces of the light reflective electrodes; a plurality of wiring electrodes that electrically connect the plurality of semiconductor light emitting cells in series, and cover the lateral surfaces of the semiconductor light emitting cells and the spaces between the semiconductor light emitting cells via the first insulation layer; and a light reflective metal layer that covers the lateral surfaces of at least two adjacent ones of the semiconductor light emitting cells and the space between said at least two semiconductor light emitting cells, via the first insulation layer, wherein the light reflective metal layer is not electrically connected with the semiconductor light emitting cells. One or more portions of the light reflective metal layer cover one or more portions of the upper surface of the light reflective electrodes disposed on the upper surfaces of each of said at least two adjacent semiconductor light emitting cells, via the first insulation layer.

The light emitting element according to the present disclosure can increase the light extraction efficiency while reducing migration of the metal materials used for the electrodes.

BRIEF DESCRIPTION

FIG. 4B is a sectional view illustrating the structure of the light emitting element according to Embodiment 2, taken along line IVB-IVB indicated in FIG. 4A.

FIG. 4C is a sectional view illustrating the structure of the light emitting element according to Embodiment 2, taken along line IVC-IVC indicated in FIG. 4A.

DESCRIPTION

Figure 1A:
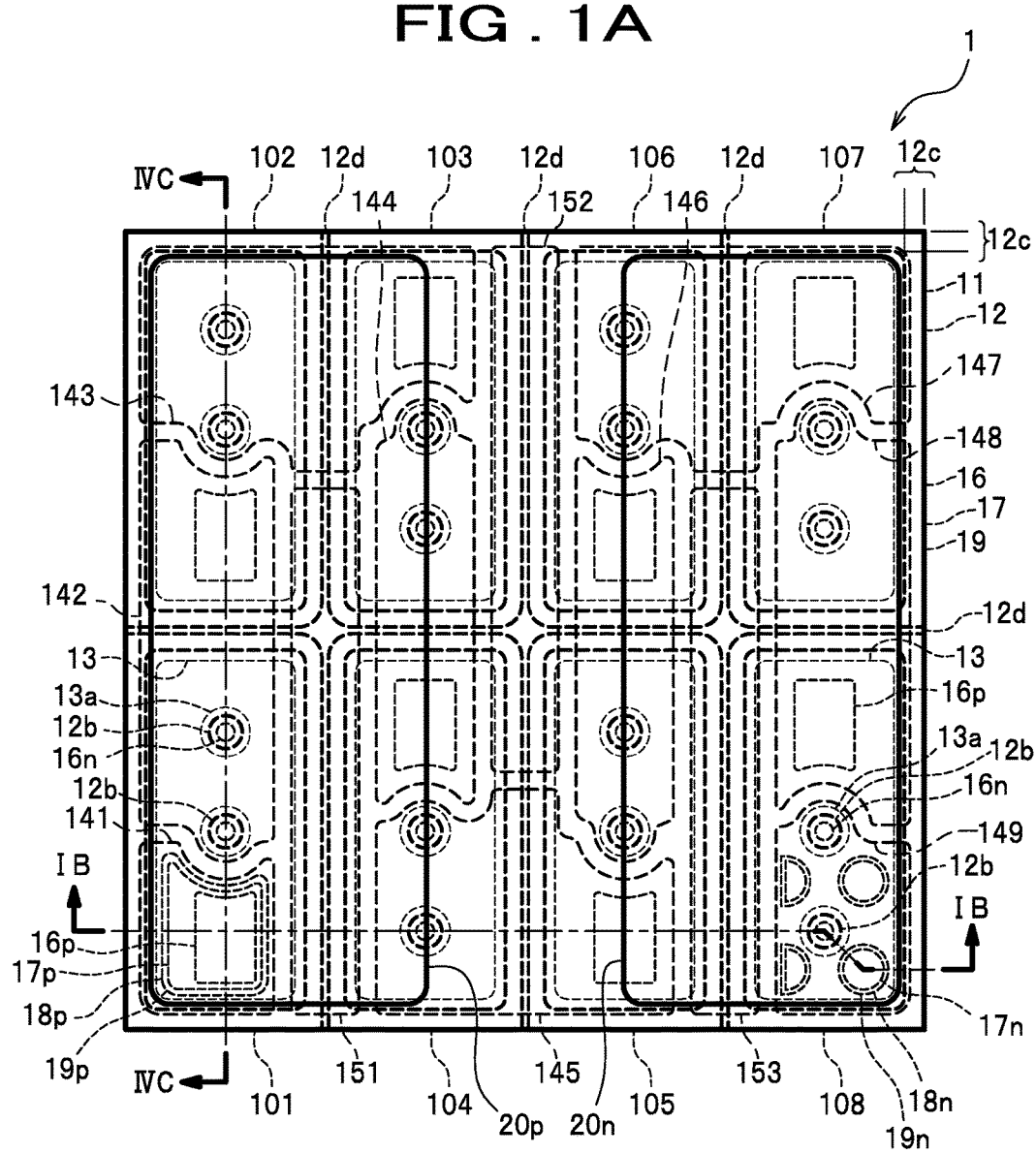
FIG. 1A is a plan view illustrating a structure of a light emitting element according to Embodiment 1.

A light emitting element according to certain embodiments of the present invention will be explained below.

The drawings referenced in the explanation below are schematic representations of the embodiments, and thus the scaling, spacing, positional relationships of the members might be exaggerated or partially omitted. Moreover, the scaling or spacing of the members might not match between the plan views and the sectional views. In the explanation below, the same or homogeneous members are given the same designations and reference numerals as a rule, the detailed explanation for which will be omitted when appropriate.

The terms, such as "upper" and "lower," herein indicate relative positions of the constituent elements, and are not intended to represent their absolute positions.

Embodiment 1

Structure of the Light Emitting Element

The structure of the light emitting element according to Embodiment 1 will be explained with reference to FIG. 1A to FIG. 3G.

Figure 1B:
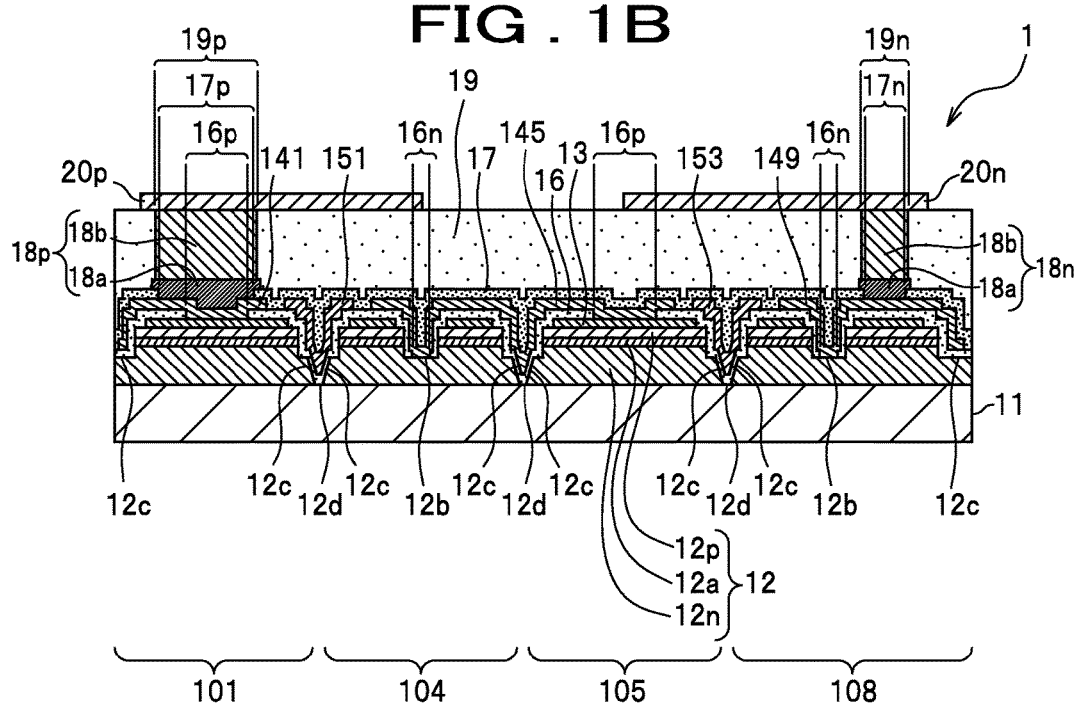
FIG. 1B is a sectional view illustrating the structure of the light emitting element according to Embodiment 1, taken along line IB-IB indicated in FIG. 1A.

The sectional view shown in FIG. 1B is a cross section taken along dashed line IB-IB indicated in FIG. 1A. FIG. 3A to FIG. 3G show the states where members are sequentially stacked from a lower layer side explaining the layered structure of the light emitting element. FIGS. 3A-3G are plan views, and hatching is applied to the uppermost layers in each drawing for explanation purposes.

Figure 1C:
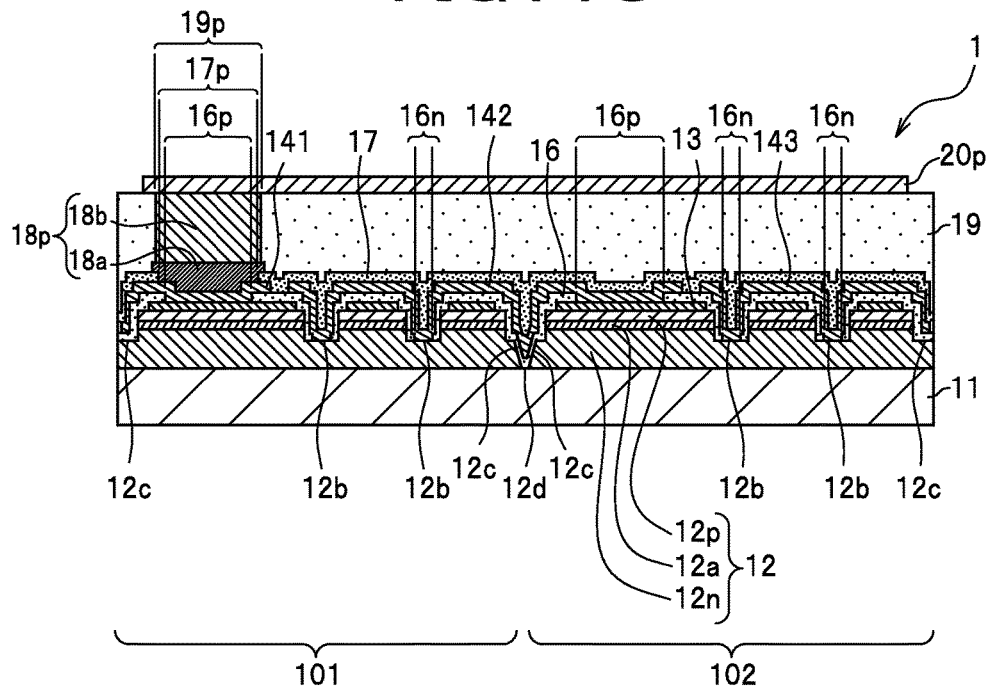
FIG. 1C is a sectional view illustrating the structure of the light emitting element according to Embodiment 1, taken along line IC-IC indicated in FIG. 1A.

A light emitting element 1, as shown in FIGS. 1A-1C, is formed to have an approximately square shape in a top view, and includes: a substrate 11; a plurality of semiconductor light emitting cells 101-108 disposed on an upper surface side of the substrate and electrically independent from one another; a plurality of light reflective electrodes 13 disposed on each of the upper surface of the plurality of semiconductor light emitting cells 101-108; a first insulation layer 16 continuously covering lateral surfaces of the semiconductor light emitting cells 101-108, the spaces between them, lateral surfaces of the light reflective electrodes 13, and a portion of upper surfaces of each of the light reflective electrodes 13; wiring electrodes 141-149 electrically connecting the plurality of semiconductor light emitting cells 101-108 in series and covering the lateral surfaces of the semiconductor light emitting cells 101-108 and the spaces between the semiconductor light emitting cells 101-108 via the first insulation layer 16; and a light reflective metal layer 151-153 covering via the first insulation layer 16 the lateral surfaces of two adjacent semiconductor light emitting cells 101-108 and the spaces between the semiconductor light emitting cells 101-108 and not electrically connected to the semiconductor light emitting cells 101-108. A portion of the light reflective metal layer 151-153 covers a portion of the upper surface of each light reflective electrode 13 disposed on the upper surfaces of two adjacent semiconductor light emitting cells 101-108 via the first insulation layer 16. The light emitting element 1 according to this embodiment includes a second insulation layer 17, metal bumps 18n and 18p, a support member 19, and external connection electrodes 20n and 20p.

The semiconductor layer 12 is divided by the grooves 12d into eight areas, two rows and four columns, and the semiconductor layer 12 in each divided area constitutes a semiconductor light emitting cell 101-108 (hereinafter referred to as "light emitting cells"). Each of the light emitting cells 101-108 has an LED structure. As shown by the equivalent circuit in FIG. 2, the light emitting cells 101-108 are serially connected via the light reflective electrodes 13 and the wiring electrodes 142-148.

Figure 2:
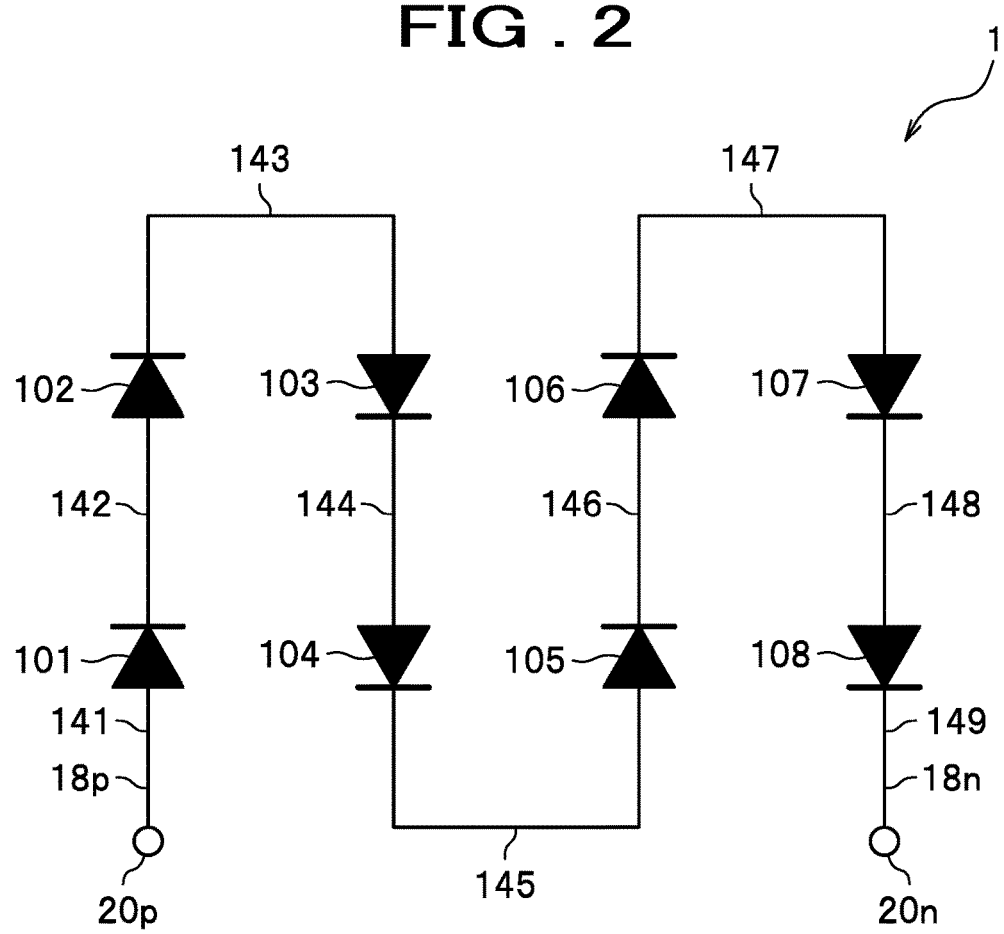
FIG. 2 is a circuit diagram showing the equivalent circuit of the light emitting element according to Embodiment 1.

Although omitted in FIG. 2, the conductive light reflective electrode 13, for example, is interposed between the p-side semiconductor layer 12p of the light emitting cell 101 and the wiring electrode 141.

The light emitting cell 101, which is one end of the serial connection, is connected to the external connection electrode 20p via the light reflective electrode 13, the wiring electrode 141 and the metal bump 18p. The light emitting cell 108, which is the other end of the serial connection, is connected to the external connection electrode 20n via the wiring electrode 149 and the metal bump 18n.

The light emitting cells 101-108 are configured to emit light by connecting the external connection electrode 20p, which is an anode of the light emitting element 1, and the external connection electrode 20n, which is a cathode of the light emitting element 1, to a power supply. The light reflective electrodes 13, the light reflective wiring electrodes 141-149, and the light reflective metal layers 151-153 are disposed on the upper surface side of the semiconductor layer 12, being the lower surface of the light emitting element 1 the light extraction surface. The light emitting element 1 has a structure suited for surface down mounting by having the external connection electrodes 20n and 20p on the upper surface side of the light emitting element 1.

Each member will be explained in detail below.

Substrate

The substrate 11 supports the semiconductor layer 12. The substrate 11 may be a growth substrate used for epitaxial growth of the semiconductor layer 12. For the substrate 11, when a nitride semiconductor is used for the semiconductor layer 12, for example, a sapphire ($Al_2O_3$) substrate can be used.

Semiconductor Layer

The semiconductor layer 12 is formed by successively layered on the upper surface of the substrate 11, i.e., one of the primary surfaces thereof, n-side semiconductor layers 12n and p-side semiconductor layers 12p, which emit light when an external power supply is connected to the wiring electrode 141 and the wiring electrode 149. As shown in FIG. 1B and FIG. 1C, it is preferable to include active layers 12a between the n-side semiconductor layers 12n and the p-side semiconductor layers 12p.

As shown in FIGS. 1A-1C and 3A, the semiconductor layer 12 is divided into eight areas by the grooves 12d shaped as three vertically extending approximately parallel grooves that are overlapped with a horizontally extending groove that is perpendicular to the three vertically extending grooves. The upper surface of the substrate 11 is exposed from the semiconductor layer 12 at the bottom surfaces of the grooves 12d. The eight divided areas individually correspond to the light emitting cells 101-108. Except for being connected via the wiring electrodes 142-148, the light emitting cells 101-108 are electrically independent from one another.

Figure 3A:
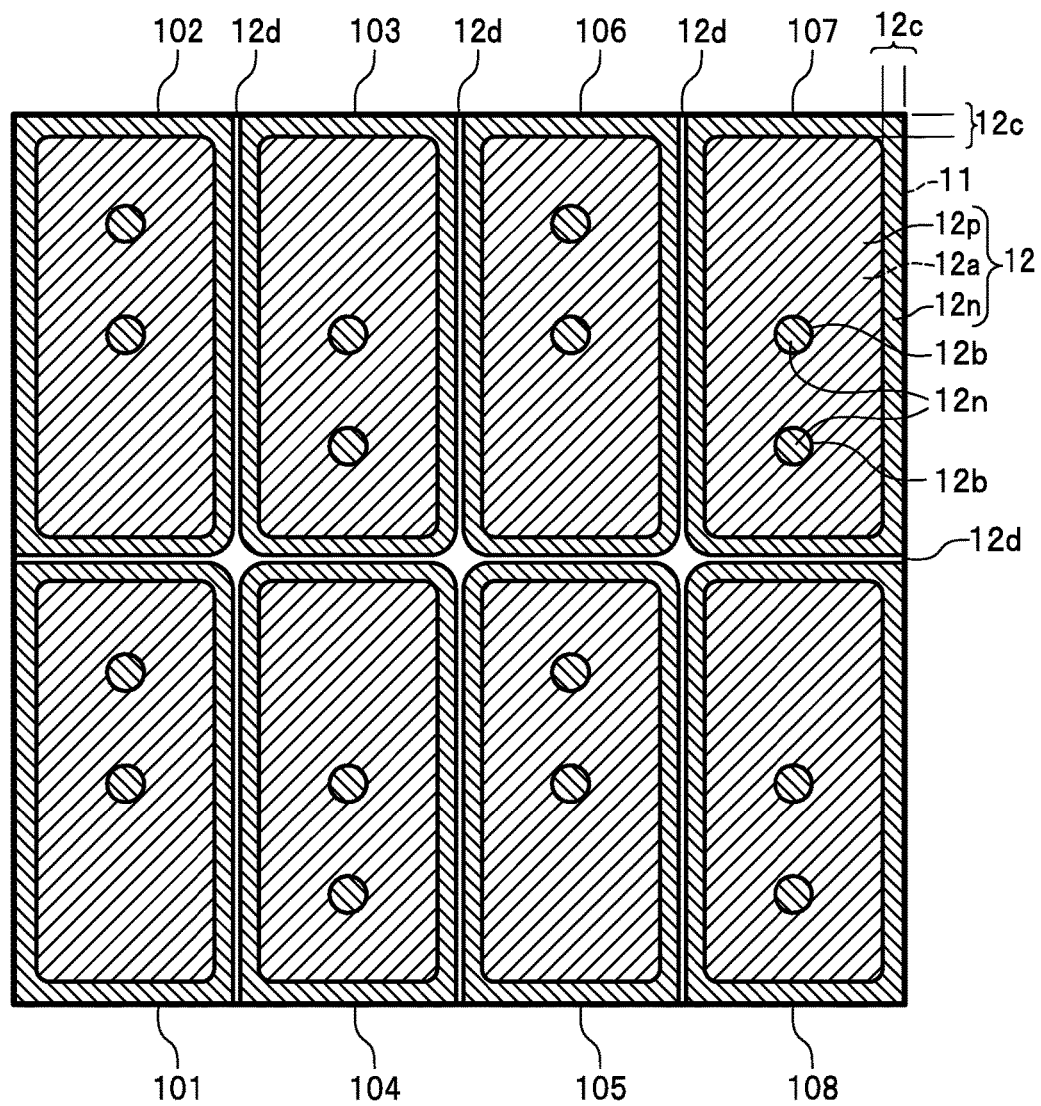
FIG. 3A is a plan view explaining the layered structure of the light emitting element according to Embodiment 1, showing the areas where n-side semiconductor layers and p-side semiconductor layers are arranged.

In each of the light emitting cells 101-108, the semiconductor layer 12 has areas where both the p-side semiconductor layers 12p and the active layers 12a are absent, i.e., the areas recessed from the surface of the p-side semiconductor layer 12p in which the n-side semiconductor layer 12n is exposed. These areas will be referred to as "the first exposed portions 12b". In FIG. 3A, the areas indicated by right-up hatching are where the p-side semiconductor layers 12p and the active layers 12a are disposed, and the areas indicated by left-up hatching represent the first exposed portions 12b and the later-described second exposed portions 12c. In FIG. 3A, moreover, the areas where no hatching is present are the bottom surfaces of the grooves 12d. The semiconductor layer 12, in each of the light emitting cells 101-108, has two first exposed portions 12b having substantially a circular shape in a plan view.

The semiconductor layer 12 has second exposed portions 12c, where the p-side semiconductor layers 12p and the active layers 12a are absent, exposing the n-side semiconductor layer 12n, along the perimeters of the light emitting cells 101-108.

For the n-side semiconductor layer 12n, the active layer 12a, and the p-side semiconductor layer 12p, a nitride semiconductor, such as $In_XAl_YGa_{1-X-Y}N$ (0≤X, 0≤Y, X+Y<1), is used.

Light Reflective Electrode

Figure 3B:
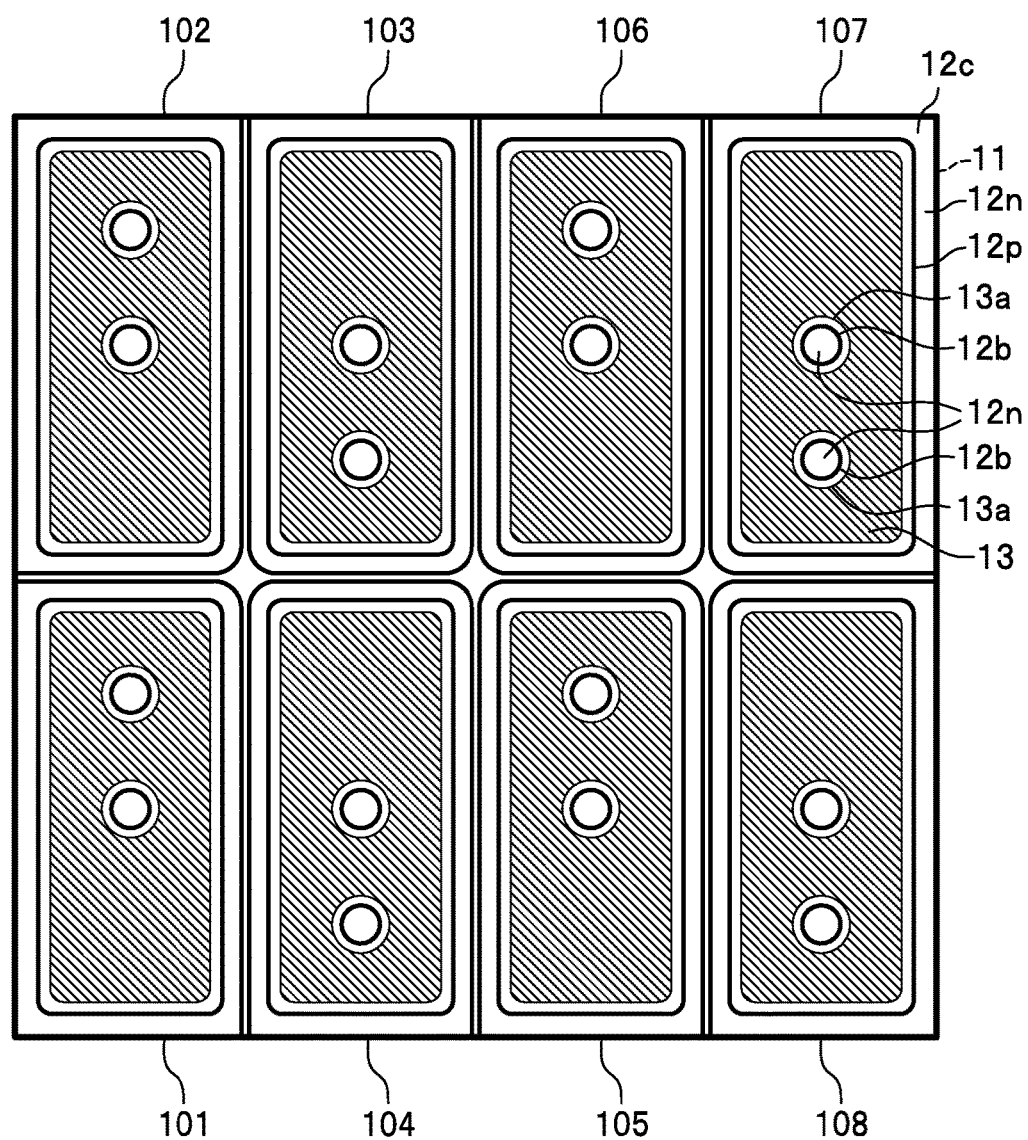
FIG. 3B is a plan view explaining the layered structure of the light emitting element according to Embodiment 1, showing areas where light reflective electrodes are arranged.

The light reflective electrodes 13 function as a current diffusion layer to diffuse the current supplied from the wiring electrodes 141-149 for supplying current to the p-side semiconductor layers 12p over a broad area. The light reflective electrodes 13 also function as a light reflective layer. The light reflective electrodes 13, indicated by left-up hatching shown in FIG. 3B, are disposed on substantially the entire areas of the upper surfaces of the p-side semiconductor layers 12p.

It is preferable for the light reflective electrodes 13 to each have a metal layer made of a metal material having good conductivity and light reflectivity. For such a metal material, for example, Ag, Al, or an alloy having either of these as a main component, can be used. Ag or an Ag alloy, which has a high light reflectance relative to the visible light emitted from the semiconductor layer 12, is particularly preferable. The light reflective electrodes 13 may have a layered structure. For example, a light reflective layer using a material having good light reflectance, such as Ag or an Ag alloy, can be provided as the lower layer, while disposing a barrier layer as the upper layer to reduce the migration of the metal material used in the light reflective layer. For the barrier layer, for example, SiN can be used.

First Insulation Layer

Figure 3C:
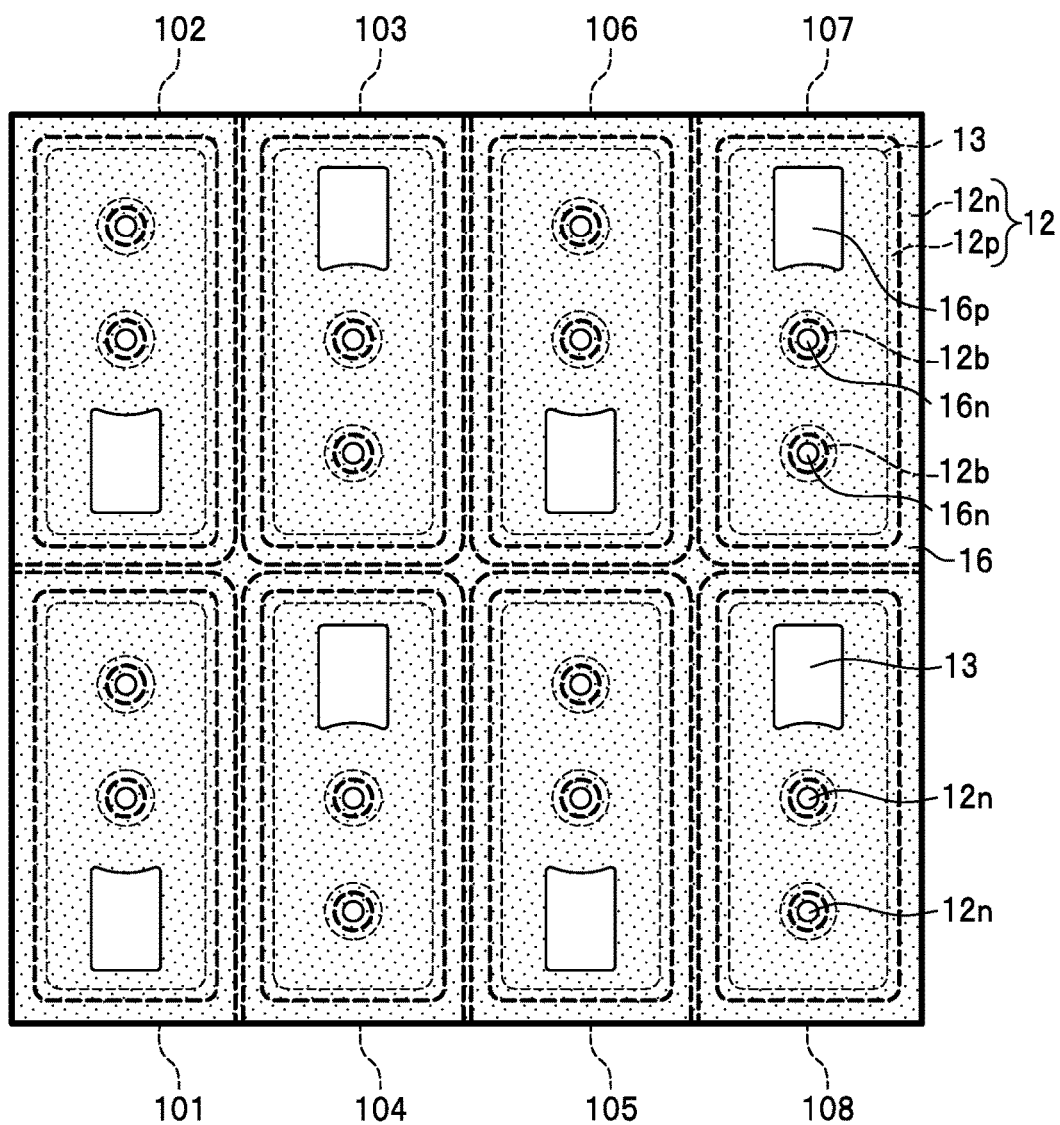
FIG. 3C is a plan view explaining the layered structure of the light emitting element according to Embodiment 1, showing area where first insulation layer is arranged.

The first insulation layer 16 is disposed in the area indicated by dot hatching in FIG. 3C. The first insulation layer 16, as shown in FIG. 1B and FIG. 1C, continuously covers the lateral surfaces of the semiconductor layer 12 of the light emitting cells 101-108, the first exposed portions 12b located between the light emitting cells 101-108, the second exposed portions 12c, grooves 12d, the lateral surfaces and the upper surfaces of the light reflective electrodes 13. The light reflective electrodes 13 might have curved surfaces at the end portions in a sectional view along the top-bottom direction. In this case, the surface substantially parallel to the upper surface of the p-side semiconductor layer 12p represents the upper surface, and the curved surfaces at the end portions represent the lateral surfaces.

In each of the light emitting cells 101-108, the first insulation layer 16 has substantially circular openings 16n where the first exposed portions 12b are disposed, and a substantially rectangular opening 16p in the area where the light reflective electrode 13 is disposed.

The first insulation layer 16 is provided for protecting the semiconductor layers 12 and the light reflective electrodes 13, and insulating the semiconductor layers 12 from the wiring electrodes 141-149 and the light reflective metal layers 151-153 disposed on the upper layer side.

For the insulation layer 16, for example, an oxide or a nitride containing at least one selected from the group consisting of Si, Ti, Zr, Nb, Ta, Al, and Hf can be used.

Among these, it is preferable to use $SiO_2$ which has a high visible light transmittance and a low refractive index. By using a material having a lower refractive index than those of the semiconductor layer 12 and the substrate 11, and a large refractive index difference from those of the semiconductor layer 12 and the substrate 11, the light can efficiently be reflected at the interfaces between these members and the first insulation layer 16. Increasing the light reflectance at the interfaces can reduce leakage of light from the upper surface side of the light emitting element 1.

Wiring Electrode

Figure 3D:
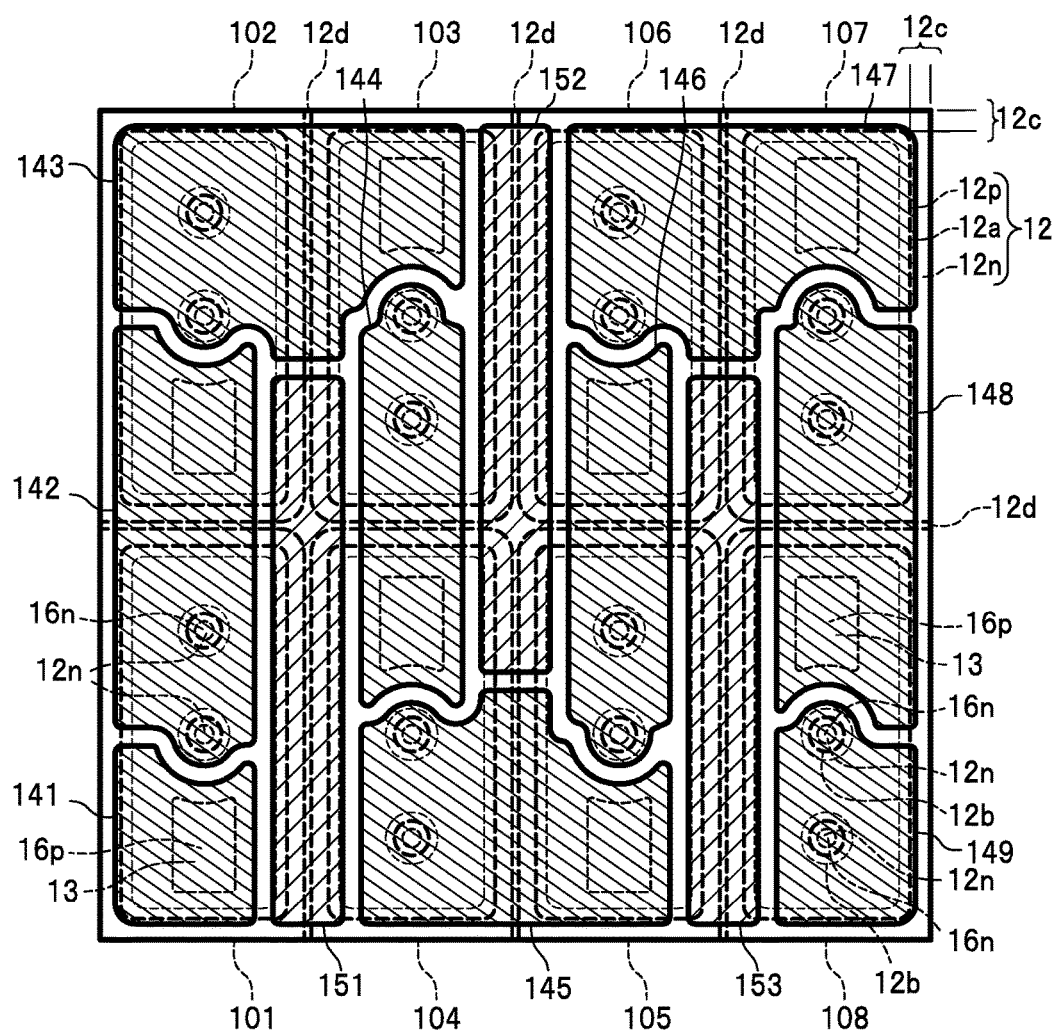
FIG. 3D is a plan view explaining the layered structure of the light emitting element according to Embodiment 1, showing areas where wiring electrodes and light reflective metal layers are arranged.

The wiring electrodes 141-149 are disposed in the areas indicated by left-up hatching in FIG. 3D, and are for electrically connecting the n-side semiconductor layers 12n and the p-side semiconductor layers 12p of each of the light emitting cells 101-108.

The wiring electrodes 142-149 are electrically connected to the n-side semiconductor layers 12n at the openings 16n of the first insulation layer 16 disposed at the first exposed portions 12b in each of the light emitting cells 101-108. The wiring electrodes 141-148 are electrically connected to the p-side semiconductor layer 12p via the light reflective electrodes 13 at the openings 16p formed on the upper surfaces of the light reflective electrodes 13.

In this embodiment, the wiring electrodes 141-149 serve as both pad electrodes for the light emitting cells 101-108 and wiring for electrically connecting the light emitting cells 101-108 with one another. Alternatively, pad electrodes may be disposed on the light emitting cells 101-108 to be connected to the wiring electrodes 141-149.

The wiring electrodes 141-149, as shown in FIG. 1B and FIG. 1C, cover the lateral surfaces of the light emitting cells 101-108 and the spaces between the light emitting cells 101-108 via the first insulation layer 16 at the first exposed portions 12b, the second exposed portions 12c, and the grooves 12d. It is particularly preferable for the wiring electrodes 141-149 to be disposed to cover the lateral surfaces which include the areas where the active layers 12a are disposed. Disposing the wiring electrodes 141-149 so as to cover at least a portion of the lateral surfaces of the light emitting cells 101-108 can reduce leakage of the light from the lateral surfaces of the light emitting cells 101-108.

When the light emitting cells 101-108 are arranged in two rows and four columns as in the case of this embodiment, i.e., when they are arranged in two or more rows and two or more columns, it is preferable to dispose the wiring electrodes 142-148 to efficiently cover the lateral surfaces of the light emitting cells 101-108 and the spaces between the light emitting cells 101-108.

With respect to the wiring electrodes for two or more light emitting cells present in each column, for example, the wiring electrode 142 electrically connecting the light emitting cells 101 and 102 is disposed so as to continuously cover the upper surfaces and the lateral surfaces of the light emitting cells 101 and 102 and the space between the light emitting cells 101 and 102.

With respect to the wiring electrode for the two light emitting cells that are arranged at the end portions of two adjacent columns on the same side, for example, the wiring electrode 143 electrically connecting the light emitting cell 102 located at the upper end of the first column and the light emitting cell 103 located at the upper end of the second column is disposed so as to continuously cover the upper surfaces and the lateral surfaces of the light emitting cells 102 and 103 and the space between the light emitting cells 102 and 103.

The wiring electrodes 141-149 preferably have a metal layer made of a metal material having good conductivity and light reflectivity. For such a metal material, Ag, Al, or an alloy of these metals can be used. Al and Al alloys are suited for the wiring electrodes 141-149 because they are highly reflective, and as compared to Ag, less likely to cause migration.

Light Reflective Metal Layer

The light reflective metal layers 151-153 are disposed in the areas indicated by right-up hatching in FIG. 3D, and are light reflective films that continuously cover the lateral surfaces of the light emitting cells 101-108, and the second exposed portions 12c and the grooves 12d located between the light emitting cells 101-108 via the first insulation layer 16. In the areas where the wiring electrodes 142-148 are disposed among the areas corresponding to the lateral surfaces of the light emitting cells 101-108 and the spaces between the light emitting cells 101-108, the wiring electrodes 142-148 function as a light reflective film. The light reflective metal layers 151-153 are disposed as a light reflective film disposed in the areas where the wiring electrodes 142-148 are absent among the lateral surfaces of the light emitting cells 101-108 and the spaces between the light emitting cells 101-108. Covering the lateral surfaces of the light emitting cells 101-108 and the spaces between the light emitting cells 101-108 with the wiring electrodes 142-148 and the light reflective metal layers 151-153 can reduce leakage of the light from the lateral surfaces of the light emitting cells 101-108 and the spaces between the light emitting cells 101-108.

The light reflective metal layers 151-153 are disposed to extend over the upper surfaces of the p-side semiconductor layers 12p so that the end portions thereof overlap with the areas where the light reflective electrodes 13 are disposed in a top view. That is, a portion of the light reflective metal layers 151-153 covers a portion of the light reflective electrodes 13 disposed on the upper surfaces of two adjacent light emitting cells 101-108 via the first insulation layer 16. This can reduce leakage of the light from the upper surface side of the light emitting cells 101-108 that travels from the areas between the light reflective metal layers 151-153 and the light reflective electrodes 13 that would not be reflected by the light reflective metal layers 151-153 or the light reflective electrodes 13 towards the light extraction surface.

It is preferable for the light reflective metal layers 151-153 to continuously cover the lateral surfaces of four of the light emitting cells 101-108 arranged in two adjacent rows. That is, the light reflective metal layers 151-153 preferably continuously cover the lateral surfaces of four of the light emitting cells 101-108, the grooves 12d located between the light emitting cells 101-108, and the intersections of the grooves 12d. The light from the active layers 12a tend to concentrate in the vicinities of the intersections of the grooves 12d. The light extraction efficiency can be increased by disposing the light reflective metal layers 151-153 in these areas to reflect the light from the active layers 12a. The number of the light emitting cells 101-108 continuously covered by the light reflective metal layers 151-153 is not limited to four. For example, if the light emitting cells are arranged in three adjacent rows, the lateral surfaces of six light emitting cells may be continuously covered.

For the light reflective metal layers 151-153, a similar material to that used for the wiring electrodes 141-149 described above can be used.

The light reflective metal layers 151-153 are not electrically connected to any of the wiring electrodes 141-149. Here, the reason why the light reflective layers 151-153 are not electrically connected to the wiring electrodes 141-149 will be explained.

One way to reduce light leaking from the lateral surfaces of the light emitting cells 101-108 and the spaces between the light emitting cells 101-108 is to increase the wiring ranges of the wiring electrodes 141-149. Since the operation of the light emitting element 1 causes a potential difference between the wiring electrodes 141-149, arranging the wiring electrodes 141-149 too close together would generate a high electric field. When a serial connection is involved, in particular, the potential difference between the wiring electrodes 141-149 is more increased as compared to a parallel connection. A high electric field readily induces migration of the metal material, such as Ag, used for the light reflective electrodes 13.

Serially connecting light emitting cells arranged in two or more rows and two or more columns, in particular, increases the likelihood of the wiring electrodes having a large potential difference between them to be arranged adjacent to one another.

In this embodiment, the eight light emitting cells 101-108 are serially connected as shown in FIG. 2. Accordingly, the further distant apart the wiring electrodes 141-149 to one another are positioned in the series circuit, the greater the potential difference results. For example, assuming that the voltage applied to the light emitting cells 101-108 is 24V, the potential difference between the wiring electrodes 141 and 142 would be 3V, while the potential difference between the wiring electrodes 141 and 145 would be 12V.

As shown in FIG. 3D, the light emitting cells 101-108 are arranged in two rows and four columns, and the wiring electrodes 141 and 145 which have a large potential difference are positioned adjacent to one another. For this reason, reducing the distance between the wiring electrodes 141 and 145 would cause a high electric field which can induce the migration of the light reflective electrodes 13.

Accordingly, in the light emitting element 1, the wiring electrodes 141-149 are arranged so that those having a particularly large potential difference are not positioned too close to one another. Moreover, in the areas where the wiring electrodes 141-149 are not provided, the light reflective metal layers 151-153 which are not electrically connected to any of the wiring electrodes 141-149 are disposed. By disposing the light reflective metal layers 151-153 not connected to the wiring electrodes 141-149 instead of reducing the spaces between the wiring electrodes 141-149, the light extraction efficiency can be increased without generating a high electric field. This, as a result, can reduce the migration of the metal material, such as Ag.

Second Insulation Layer

Figure 3E:
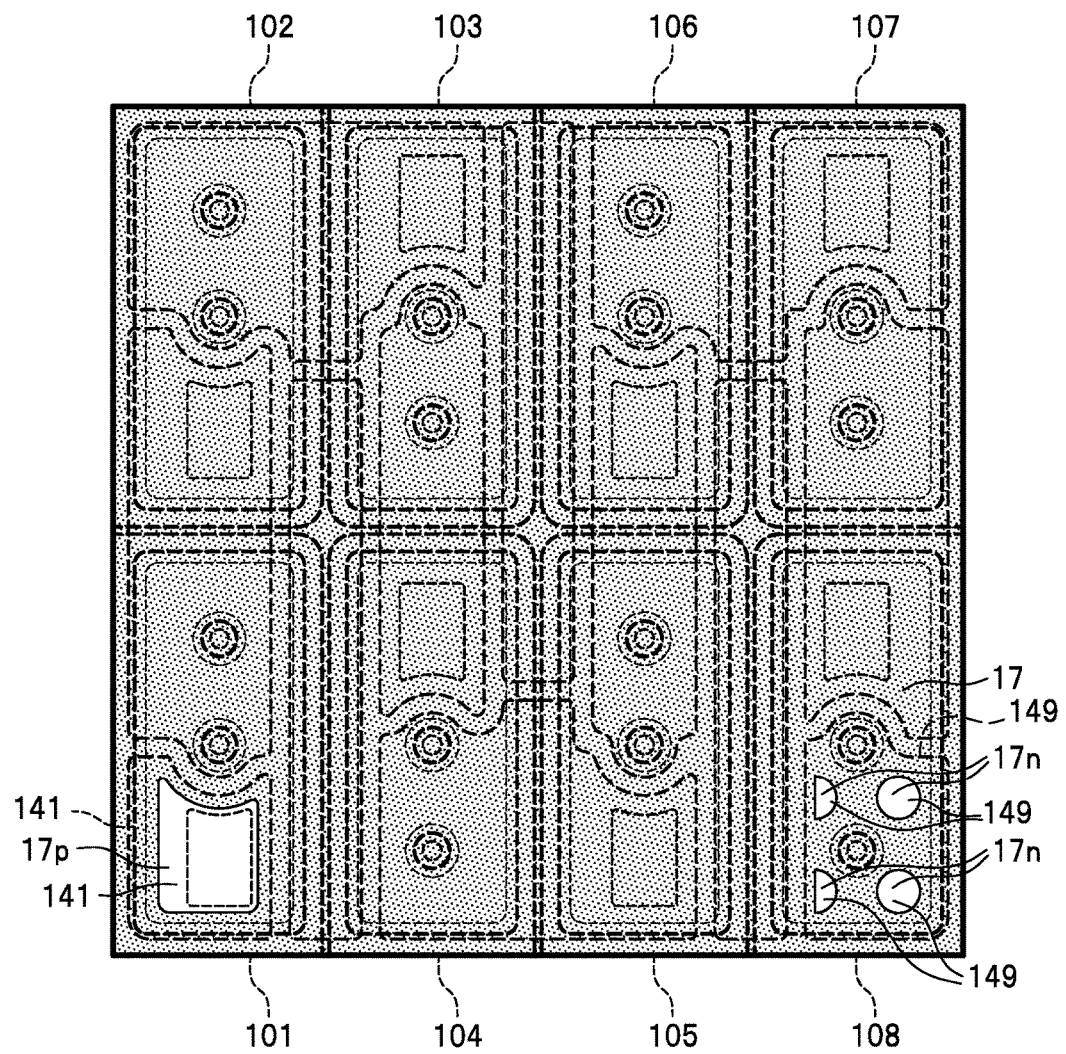
FIG. 3E is a plan view explaining the layered structure of the light emitting element according to Embodiment 1, showing area where the second insulation layer is arranged.

The second insulation layer 17, as indicated by dot hatching in FIG. 3E, continuously covers substantially the entire surface of the first insulation layer 16, the wiring electrodes 141-149, and the light reflective metal layers 151-153 disposed thereunder. The second insulation layer 17 has substantially rectangular openings 17p over a portion of the wiring electrode 141, and circular and semicircular openings 17n over some portions of the wiring electrode 149.

The opening 17p is disposed at one location, and the openings 17n are disposed at four locations, but the numbers or the shapes of the openings 17p and 17n can be appropriately selected.

The second insulation layer 17 is a protective film for protecting the wiring electrodes 141-149 and the light reflective metal layers 151-153.

The second insulation layer 17 can employ the same or similar material to that used for the first insulation layer 16 described above. The first insulation layer 16 and the second insulation layer 17 may be made of different materials.

Metal Bumps

Metal bumps 18p and 18n are wiring for electrically connecting the wiring electrodes 141 and 149 to the external connection electrodes 20p and 20n. As shown in FIG. 1B, the metal bumps 18p and 18n are disposed in the openings 19p and 19n that penetrate the support member 19 in the thickness direction.

Figure 3F:
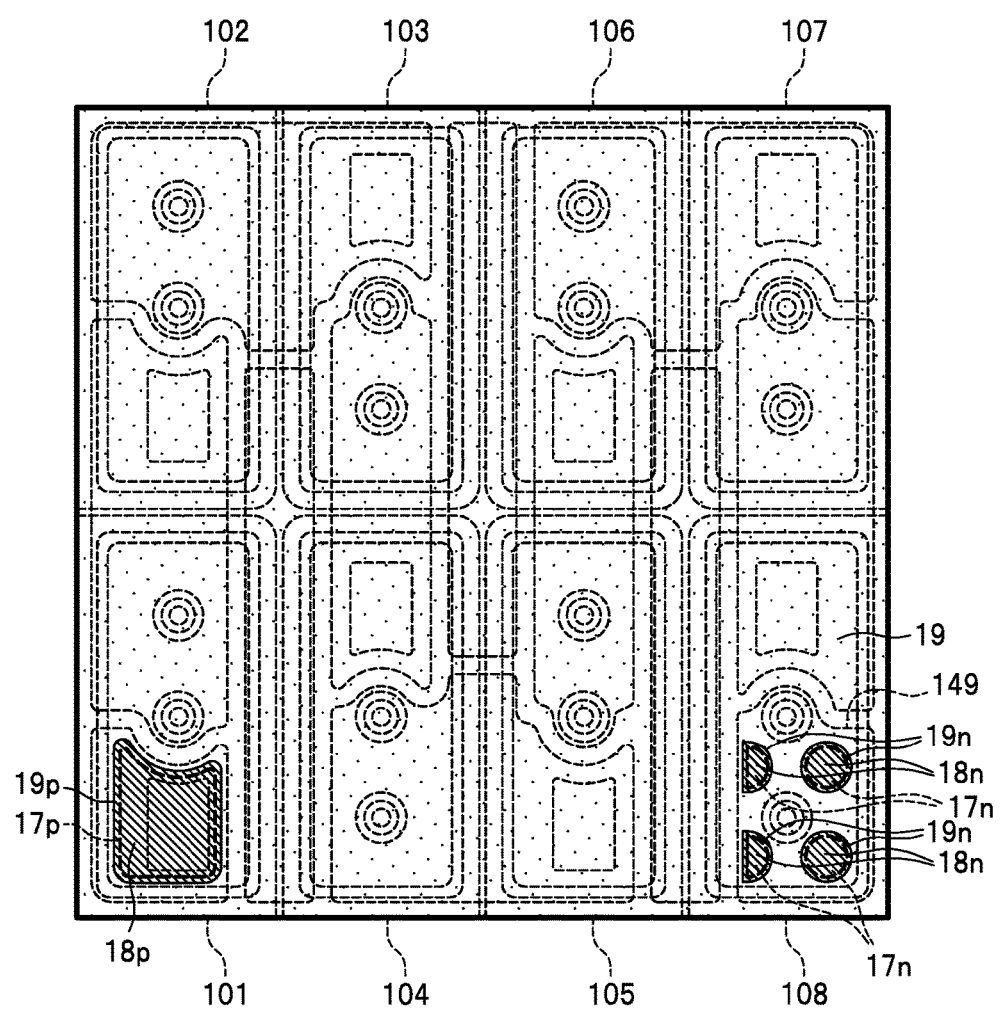
FIG. 3F is a plan view explaining the layered structure of the light emitting element according to Embodiment 1, showing areas where metal bumps and support member are arranged.

As indicated by left-up hatching in FIG. 3F, the metal bump 18p is connected to the upper surface of the wiring electrode 141 in the opening 17p of the second insulation layer 17, and is formed to substantially the same shape as that of the opening 17p in a top view. The upper surface of the metal bump 18p is connected to the lower surface of the external connection electrode 20p.

The metal bumps 18n are connected to the upper surface of the wiring electrode 149 at the four openings 17n of the second insulation layer 17, and are formed to substantially the same shape as those of the openings 17n. The upper surfaces of the metal bumps 18n are connected to the lower surface of the external connection electrode 20n.

For the metal bumps 18p and 18n, a metal such as Cu, Au, Ni, or the like can be used. The metal bumps 18p and 18n may have a layered structure using several different metals.

The metal bumps 18p and 18n in this embodiment are each composed of a seed layer 18a for plating, and a plated layer 18b disposed on the upper surface of the seed layer 18a. The seed layers 18a are metal layers that serve as a current path during the formation of the plated layer 18b by electroplating, and can be formed by sputtering, vapor deposition, or the like.

In this embodiment, in a top view, the metal bumps 18p and 18n are disposed in the areas where the p-side semiconductor layers 12p of the light emitting cells 101 and 108 are disposed, respectively, but they may be disposed to extend in a broad range over the second insulation layer 17. Alternatively, only the seed layers 18a may be each disposed on a portion of the second insulation layer 17 in a broad range as the metal layer to be electrically connected to the wiring electrodes 141 and 149, while the plated layers 18b are disposed on each portion of the seed layer 18a.

When disposing the seed layers 18a to extend over a broad range, it is preferable to dispose them to each cover at least a portion of the area where none of the light reflective electrodes 13, the wiring electrodes 141-149, and light reflective metal layers 151-153 are provided in a top view. In this embodiment, the light reflective electrodes 13 and the wiring electrodes 141-149 are provided so as not to be electrically connected to the light reflective metal layers 151-153, which might make it difficult for these members to cover all the light emitting cells 101-108 and the grooves 12d. In this embodiment, in particular, there are areas of the grooves 12d and their vicinities that are not covered by any of the light reflective electrodes 13, the wiring electrodes 141-149, and the light reflective metal layers 151-153.

Accordingly, disposing the seed layers 18a to each cover a broad range allows for the seed layers 18a to reflect the light from the light emitting element 1, further reducing the leakage of light.

Specifically, for example, in a top view, the seed layers 18a of the metal bump 18p and the seed layers 18a of the metal bumps 18n are disposed so as to extend in substantially the same ranges as those areas where the external connection electrodes 20p and 20n are disposed, corresponding to the respective polarities. Such a seed layer 18a can cover many of the areas where none of the light reflective electrodes 13, the wiring electrodes 141-149, and the light reflective metal layers 151-153 are disposed.

Providing the seed layers 18a in such a broad range can facilitate efficient dissipation of the heat generated by the light emitting element 1.

It is preferable for the seed layers 18a to each have a metal layer made of a metal material having good conductivity and light reflectivity. Examples of such metal materials include Al, Ag, Al alloys, and Ag alloys. Furthermore, it is preferable for the seed layers 18a to be each disposed so that the metal layer made of Al, Ag, an Al alloy, or an Ag alloy is in contact with the second insulation layer 17. This allows for efficient reflection of the light from the light emitting cells 101-108 traveling towards the second insulation layer 17.

Support Member

The support member 19 is disposed on the upper surface side of the semiconductor layers 12 via the second insulation layer 17 to support the metal bumps 18n and 18p as well as the external connection electrodes 20n and 20p. The support member 19, as indicated by dot hatching in FIG. 3F, is substantially square-shaped, as in the case of the outline of the light emitting element 1 in a top view. The support member 19 has a substantially rectangular opening 19p over one portion of the wiring electrode 141, and a total of four circular and semicircular openings 19n over portions of the wiring electrode 149.

The metal bump 18p is disposed in the opening 19p, and the metal bumps 18n are disposed in the openings 19n. The external connection electrodes 20n and 20p are disposed on the upper surface of the support member 19. The upper surface of the support member 19 serves as the mounting surface.

The support member 19 can be formed, for example, by using a resin material. Resin materials known in the art can be used, and for example, epoxy resins, silicone resins, or the like can be used.

The resin materials mentioned above can contain a light reflecting substance, such as $TiO2$, $Al_2O_3$, $ZrO_2$, MgO, or the like can be added to have light reflectivity, or can contain carbon black or the like to increase the thermal conductivity.

External Connection Electrodes

Figure 3G:
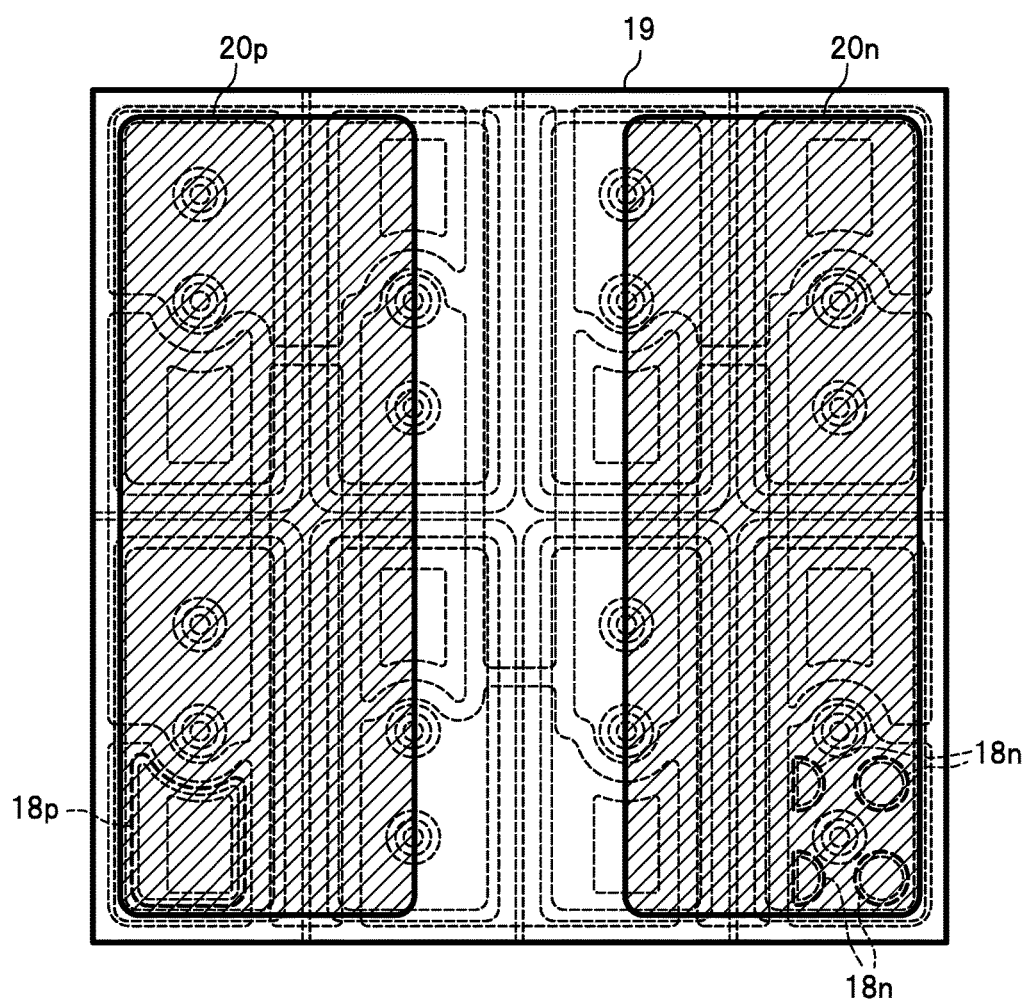
FIG. 3G is a plan view explaining the layered structure of the light emitting element according to Embodiment 1, showing the areas where the external connection electrodes are arranged.
Figure 4A:
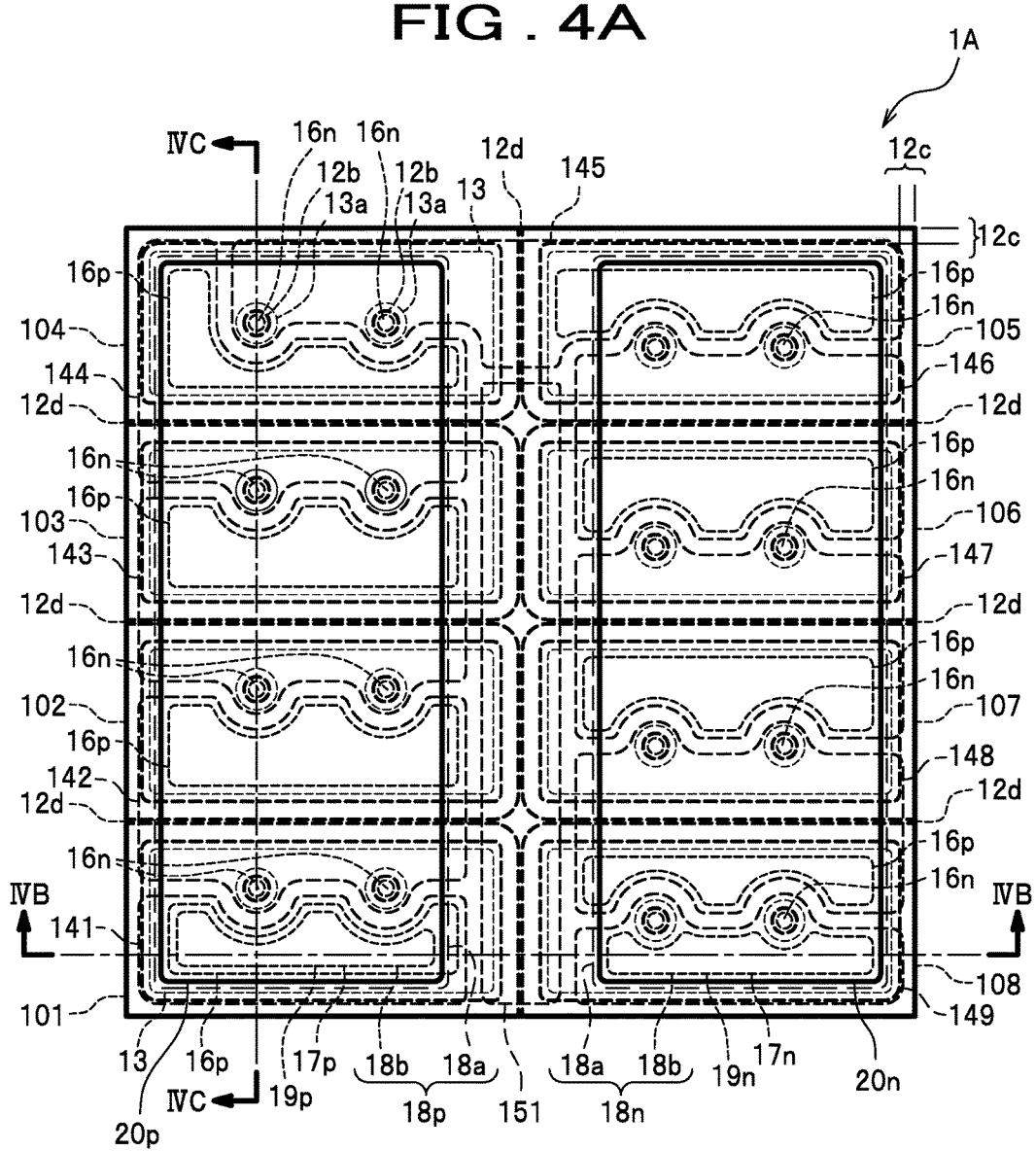
FIG. 4A is a plan view explaining a structure of a light emitting element according to Embodiment 2.
Figure 5:
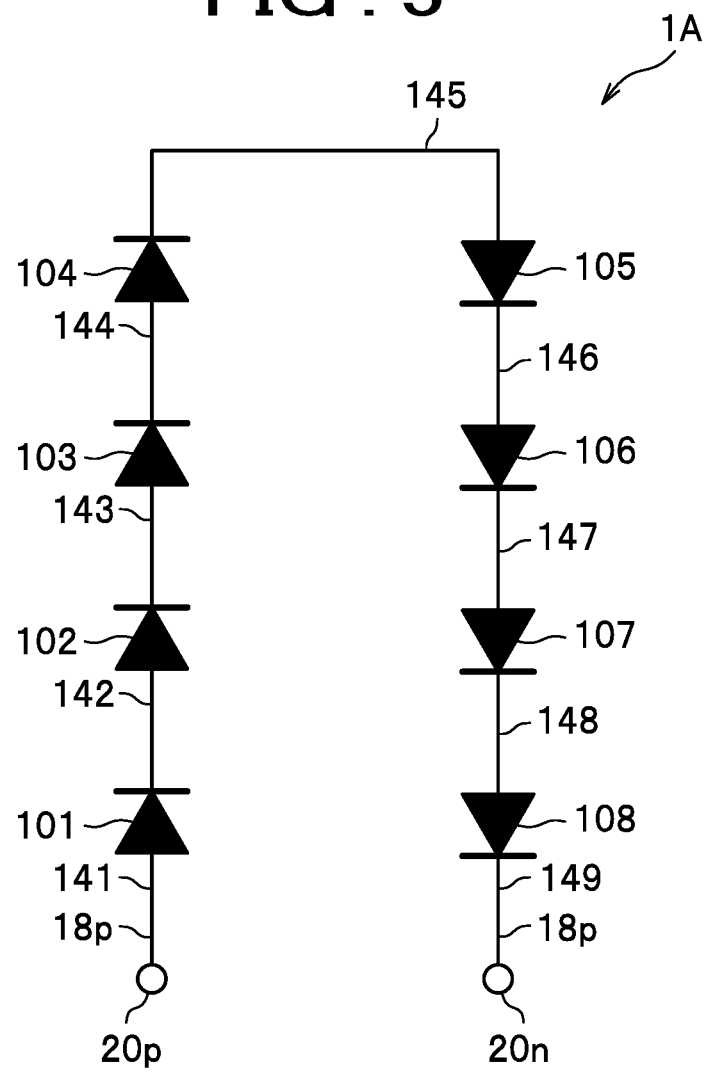
FIG. 5 is a circuit diagram showing the equivalent circuit of the light emitting element according to Embodiment 2.

The external connection electrodes 20n and 20p, as indicated by right-up hatching in FIG. 3G, are disposed on the upper surface of the support member 19 in substantially rectangular shapes, and are terminals for connecting an external power supply to the light emitting element 1. The external connection electrodes 20n and 20p are in contact with upper surfaces of the metal bumps 18*n* and 18*p*, respectively, to be electrically connected.

For the external connection electrodes 20*n* and 20*p*, a metal such as Cu, Au, Ni, or the like can be used. The external connection electrodes 20*n* and 20*p*, moreover, may be of a layered structure using several different metals. It is preferable to form at least the uppermost layer of the external connection electrodes 20*n* and 20*p* with Au in order to improve corrosion resistance and adhesion with the mounting board which uses an Au alloy-based bonding member such as an Au—Sn eutectic solder.

Variation

The shape of the light emitting cells 10 can be a circular, an elliptical or a polygonal shape, such as a square, hexagon, as well as rectangle. Moreover, the number of light emitting cells 10 can be any as long as it is two or more. The light emitting cells 10 can include a parallel connection so long as there are two or more cells connected in series.

Embodiment 2

Structure of Light Emitting Device

The light emitting element according to Embodiment 2 will be explained with reference to FIG. 4A to FIG. 6H.

FIG. 6A to FIG. 6H correspond to FIG. 3A to FIG. 3G referenced in the explanation of Embodiment 1, showing the states where the members are successively stacked from the lower layer side. FIG. 6A to FIG. 6H are plan views, but hatching is applied to the uppermost layer in each drawing for the purpose of explanation wherein similar hatching is applied to similar members to those of Embodiment 1.

The light emitting element 1A according to Embodiment 2 has eight sections of laterally oblong light emitting cells 101-108 in a plan view. The eight light emitting cells 101-108 are electrically connected in series via the light reflective electrodes 13 and the wiring electrodes 142-148 as shown by the equivalent circuit in FIG. 5.

Figure 6A:
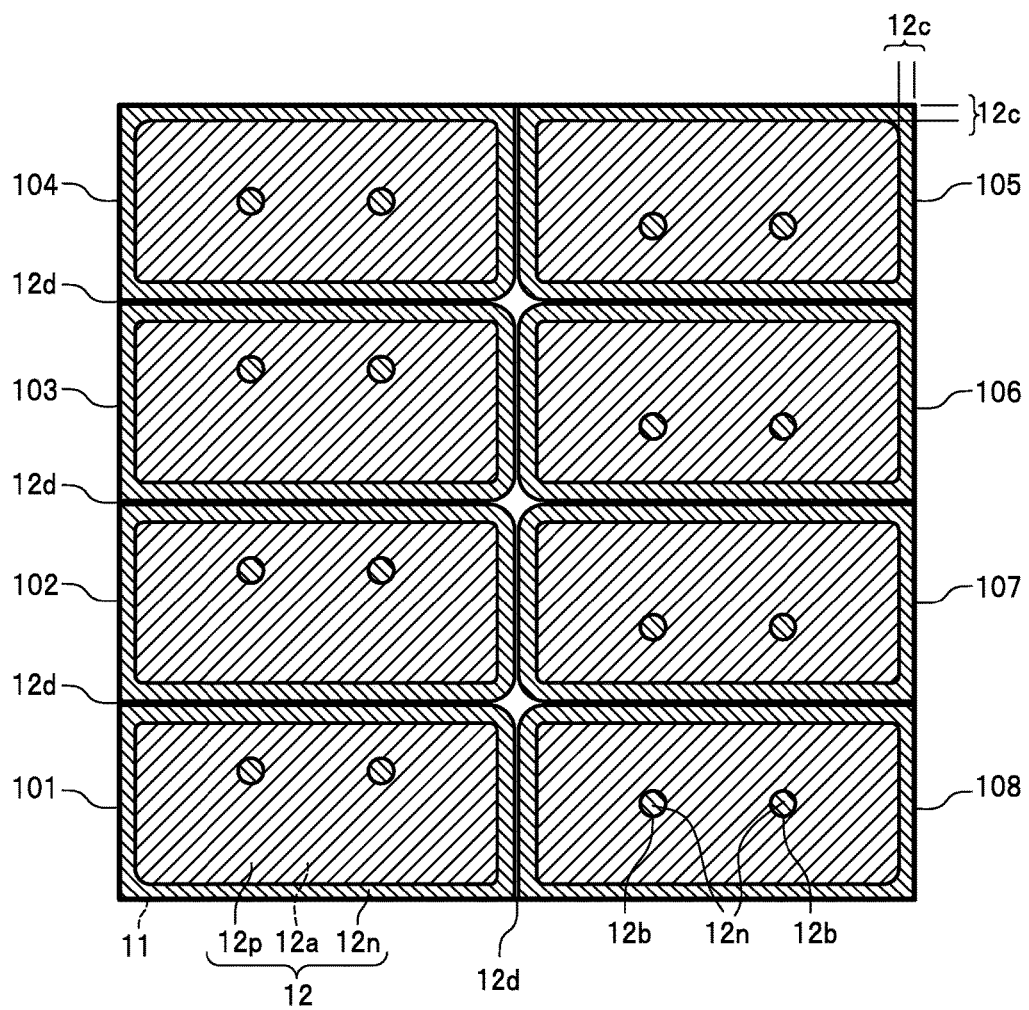
FIG. 6A is a plan view explaining the layered structure of the light emitting element according to Embodiment 2, showing areas where n-side semiconductor layers and p-side semiconductor layers are arranged.

As shown in FIG. 6A, as compared to the light emitting element 1 according to Embodiment 1, the light emitting element 1A has the light emitting cells 101-108 oriented differently, i.e., each cell is defined to be laterally long. The light emitting element 1A also has the first exposed portions 12*b* for contacting with the n-side semiconductor layers 12*n* at different locations.

Figure 6B:
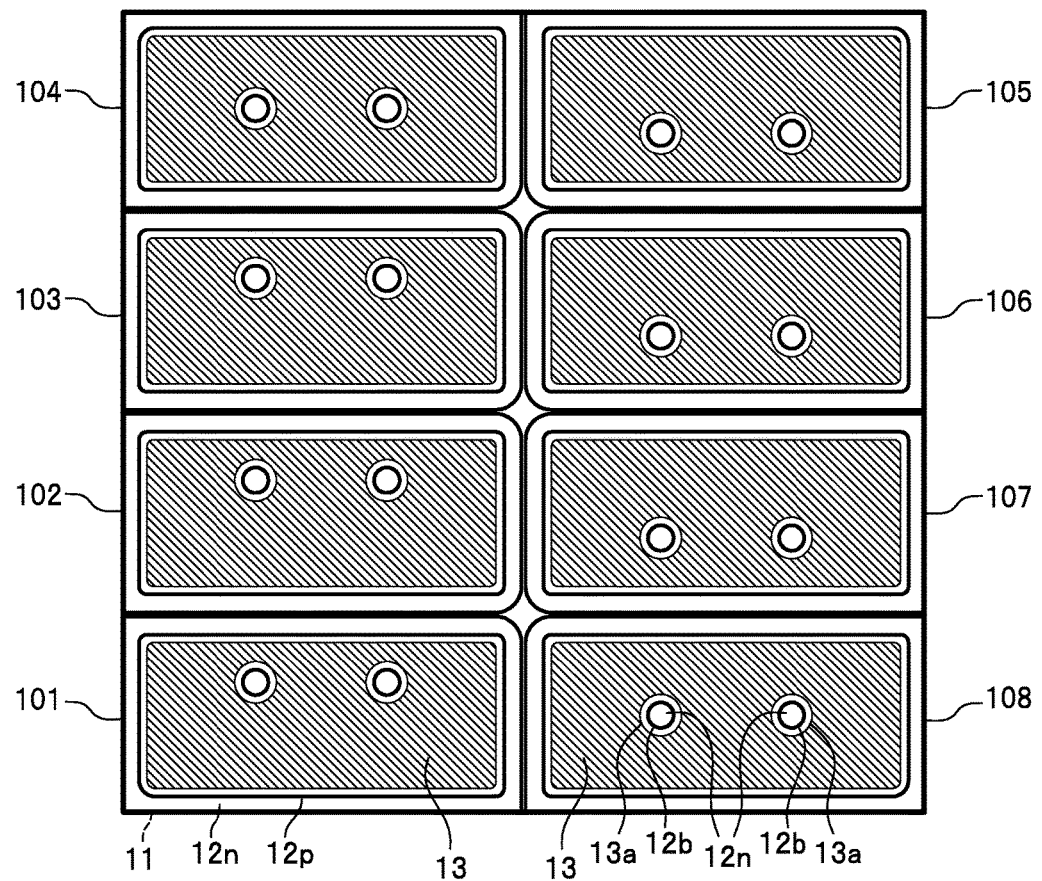
FIG. 6B is a plan view explaining the layered structure of the light emitting element according to Embodiment 2, showing the areas where light reflective electrodes are arranged.

As shown in FIG. 6B, moreover, the light reflective electrodes 13 are disposed on substantially the entire upper surfaces of the p-side semiconductor layers 12*p* of each of the light emitting cells 101-108.

Figure 6C:
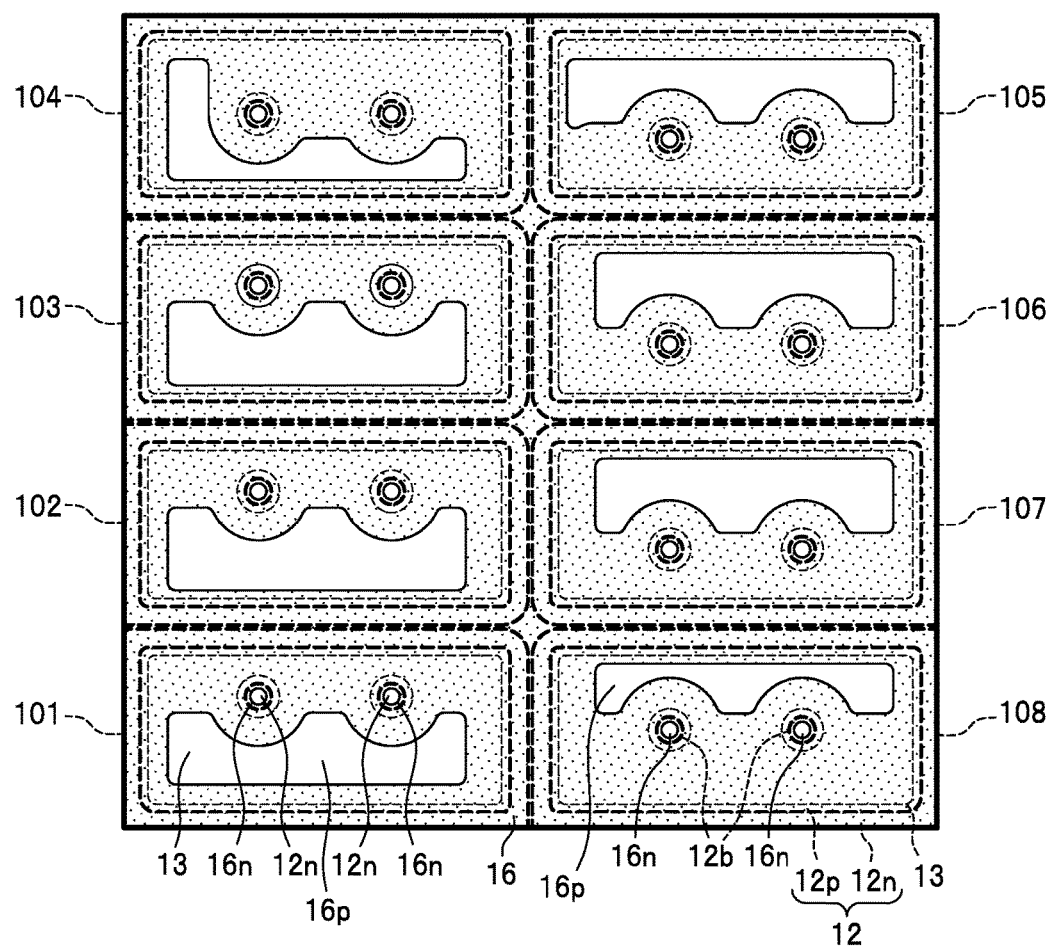
FIG. 6C is a plan view explaining the layered structure of the light emitting element according to Embodiment 2, showing area where first insulation layer is arranged.

As shown in FIG. 6C, in this embodiment, the first insulation layer 16 has openings 16*n* and 16*p* for connecting with the wiring electrodes 141-149 at the positions that are suited for the serial connection described above. Specifically, in each of the light emitting cells 101-104 arranged in the left column, the opening 16*p* is positioned lower than the locations of the first exposed portions 12*b* where the openings 16*n* are provided. In each of the light emitting cells 105-108 arranged in the right column, the opening 16*p* is positioned higher than the positions of the first exposed portions 16*b* where the openings 16*n* are provided.

Figure 6D:
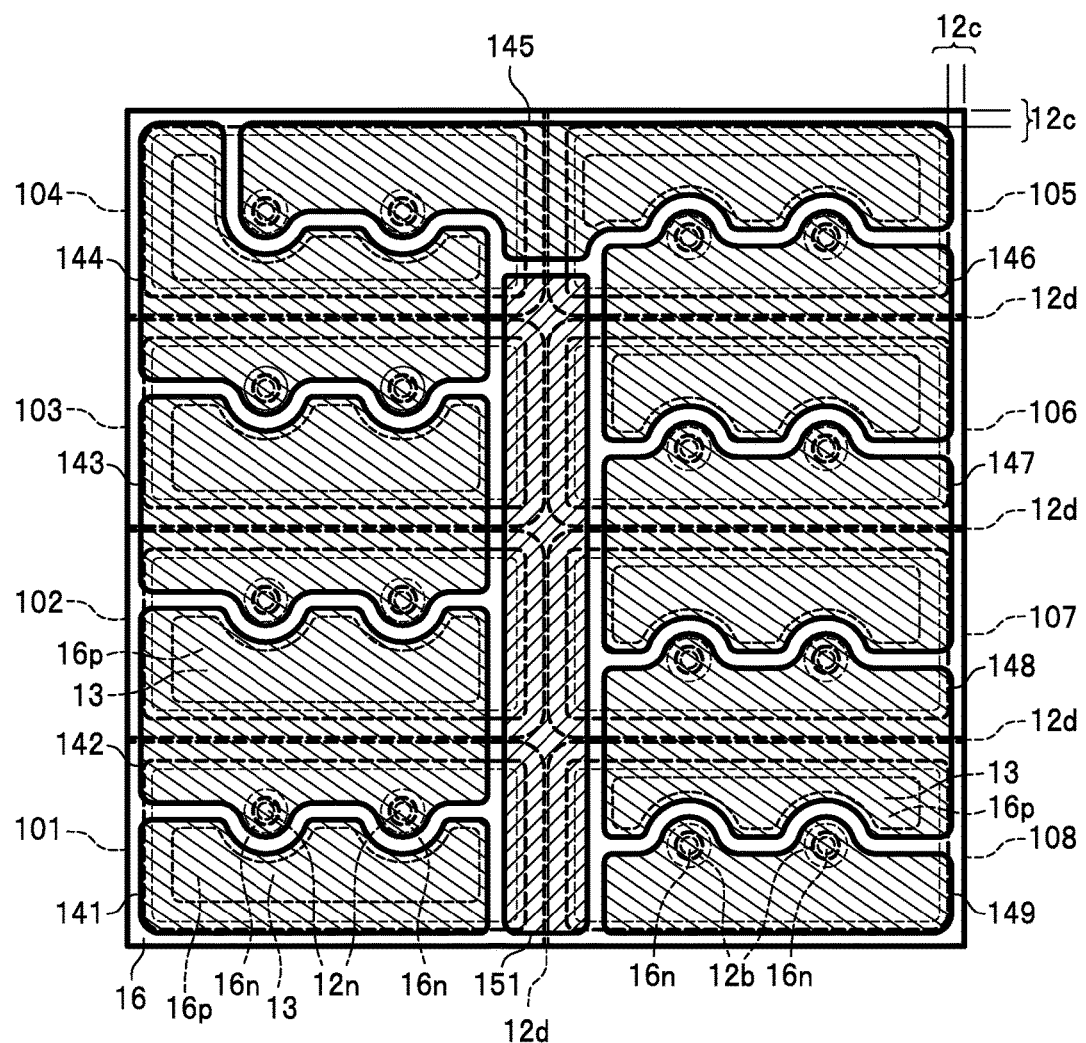
FIG. 6D is a plan view explaining the layered structure of the light emitting element according to Embodiment 2, showing areas where wiring electrodes and light reflective metal layer are arranged.

As shown in FIG. 6D, the wiring electrode 141 is electrically connected to the p-side semiconductor layer 12*p* of the light emitting cell 101, and the wiring electrode 149 is electrically connected to the n-side semiconductor layer 12*n* of the light emitting cell 108, each serving as a terminal for the series circuit. The light emitting cells 101-104 arranged in the left column are successively connected by the wiring electrodes 142-144 from bottom to top. The uppermost light emitting cell 104 in the left column is connected to the uppermost light emitting cell 105 in the right column by the wiring electrode 145. The light emitting cells 105-108 arranged in the right column are successively connected by the wiring electrodes 146-148 from top to bottom.

In this embodiment, the wiring electrodes 142-148 are disposed to straddle the grooves 12*d*, but do not straddle the corners of the light emitting cells 101-108 at the locations where the vertically extending groove 12*d* intersects with the horizontally extending grooves 12*d*.

The light reflective metal layer 151 is disposed to cover a portion of the vertically extending groove 12*d* and its vicinity along the groove 12*d* in a top view.

Figure 6E:
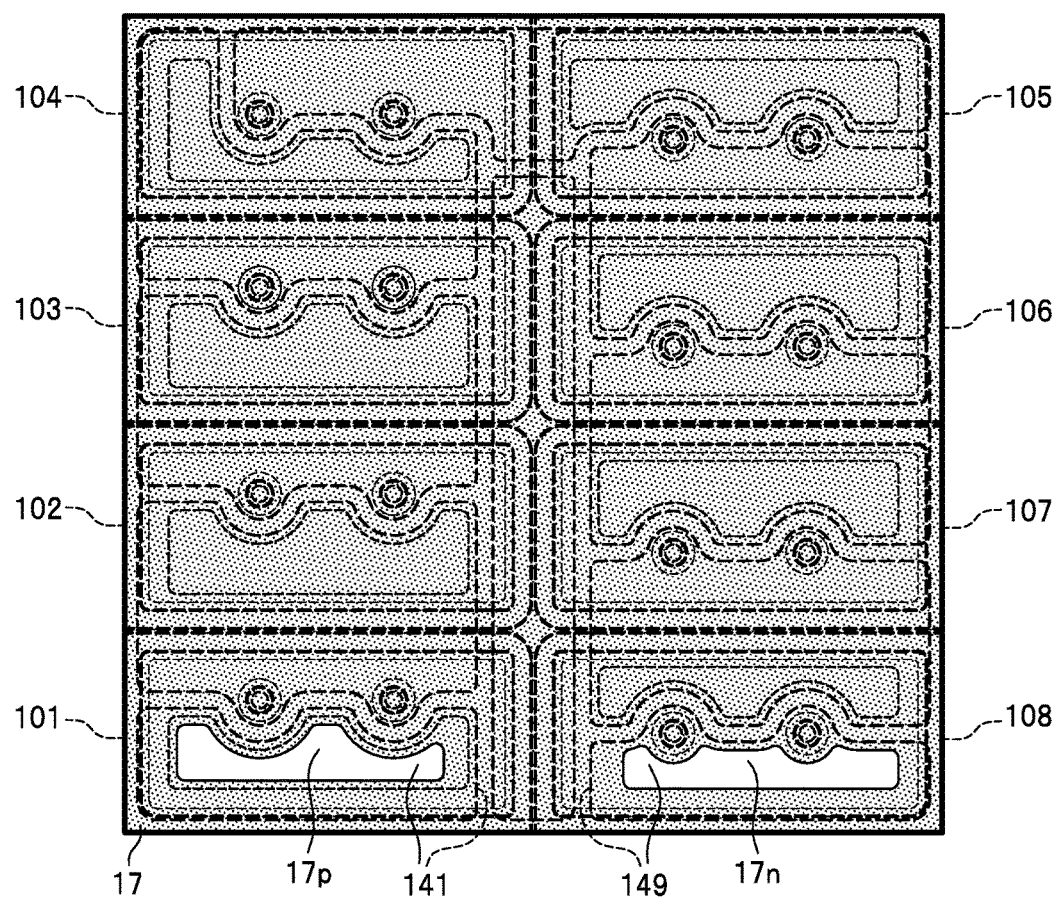
FIG. 6E is a plan view explaining the layered structure of the light emitting element according to Embodiment 2, showing area where second insulation layer is arranged.

As shown in FIG. 6E and FIG. 4C, the second insulation layer 17 has an opening 17*p* on the wiring electrode 141 and an opening 17*n* on the wiring electrode 149, and is disposed to cover the wiring electrodes 141-149, the light reflective metal layer 151, and the first insulation layer 16.

Figure 6F:
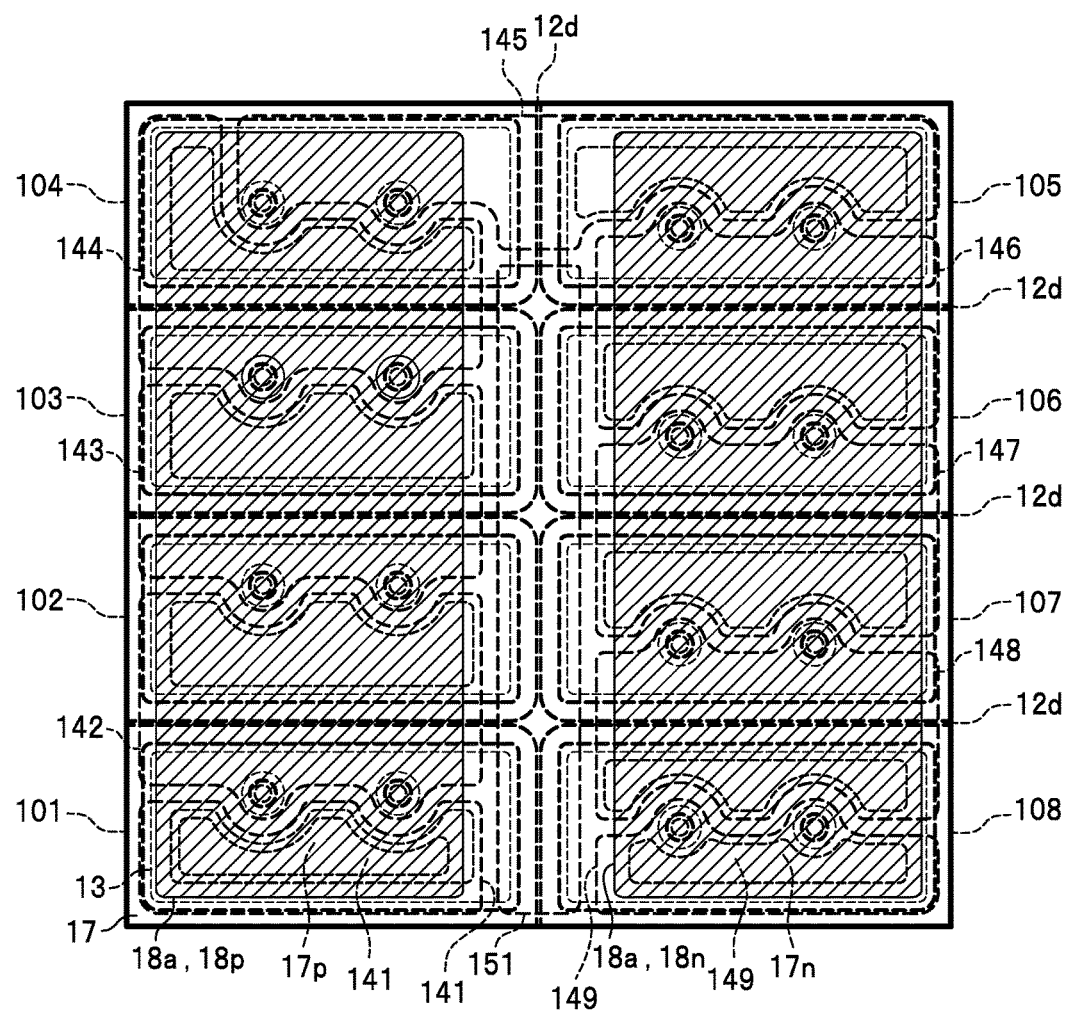
FIG. 6F is a plan view explaining the layered structure of the light emitting element according to Embodiment 2, showing areas where seed layers of metal bumps are arranged.

In FIG. 6F, as indicated by right-up hatching, the seed layer 18*a* that is the lower layer of the metal bump 18*p* is electrically connected to the wiring electrode 141 at the opening 17*p* of the second insulation layer 17, and is disposed to extend in a broad range on the upper surface of the second insulation layer 17. The seed layer 18*a* that is the lower layer of the metal bump 18*n* is electrically connected to the wiring electrode 149 at the opening 17*n* of the second insulation layer 17, and is disposed to extend in a broad range on the upper surface of the second insulation layer 17. The seed layers 18*a* of the metal bumps 18*p* and 18*n* are disposed away from each other so as to each cover the left half and the right half of the light emitting element 1A while avoiding the end portions of the wiring electrodes 141-149 disposed on the grooves 12*d*.

Disposing the seed layers 18*a* to extend over broad ranges in this manner can improve dissipation of the heat generated by the light emitting element 1A. Providing the seed layers 18*a* in broad ranges can further reduce leakage of light from the upper surface side of the light emitting element 1A.

Figure 6G:
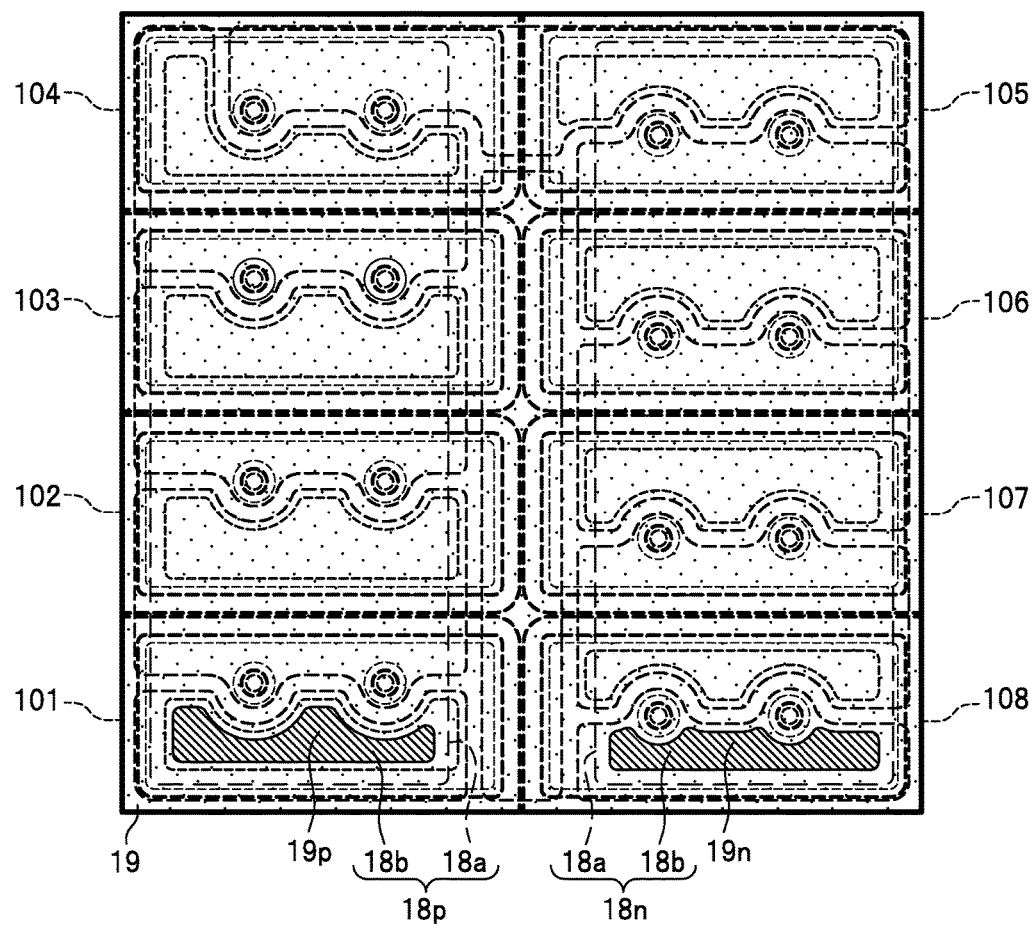
FIG. 6G is a plan view explaining the layered structure of the light emitting element according to Embodiment 2, showing areas where support member and the plated layer of the metal bumps are arranged.

As shown in FIG. 6G, the support member 19 has an opening 19*p* in a portion of the area over the p-side seed layer 18*a* and an opening 19*n* in a portion of the area over the n-side seed layer 18*a*, and is disposed to cover the remaining portions of the seed layers 18*a* and the second insulation layer 17. In the openings 19*p* and 19*n*, plated layers 18*b* which are upper layers of the metal bumps 18*n* and 18*p* of the corresponding polarities are provided.

In this embodiment, the openings 19*p* and 19*n* where the plated layers 18*b* are each disposed are provided in the areas within the openings 17*p* and 17*n* of the second insulation layer 17. The plated layers 18*b* may be disposed in substantially the same areas as the openings 17*p* and 17*n*, or in larger areas than the openings 17*p* and 17*n*.

Figure 6H:
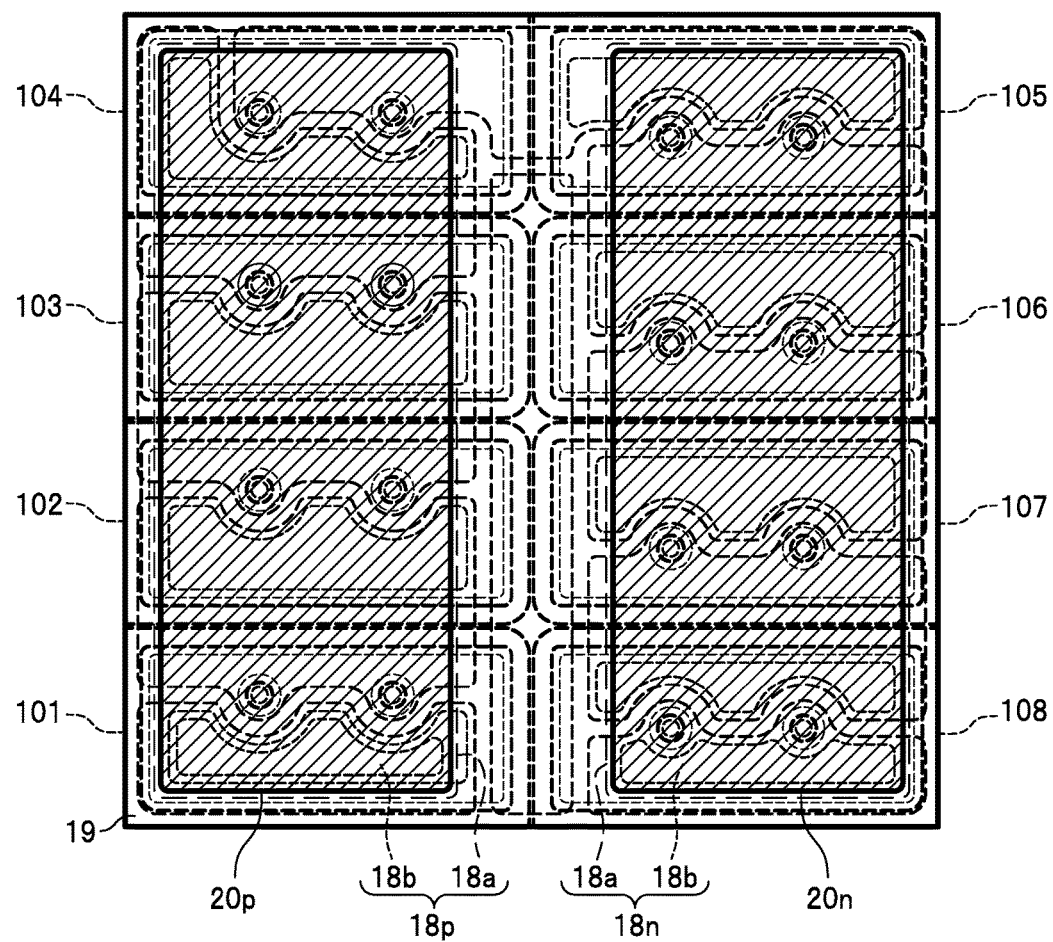
FIG. 6H is a plan view explaining the layered structure of the light emitting element according to Embodiment 2, showing areas where external connection electrodes are arranged.

As shown in FIG. 6H, the external connection electrodes 20*p* and 20*n* are disposed in the left and the right portions of the support member 19 so as to be spaced apart. The external connection electrode 20*p* is electrically connected to the wiring electrode 141 via the metal bump 18*p*, while the external connection electrode 20*n* is electrically connected to the wiring electrode 149 via the metal bump 18*n*.

In this embodiment, in a top view, the end portions of the wiring electrodes 141-149 which are disposed on the grooves 12*d* are not located in the areas where the seed layers 18*a* are provided.

The reason that it is preferable to dispose the seed layers 18*a* so as to avoid the areas where the end portions of the wiring electrodes 141-149 are formed, particularly the areas where the end portions of the wiring electrodes 141-149 disposed over the grooves 12d are located, will be explained.

It has been known that protrusions tend to form at the end portions of the wiring electrodes 141-149, particularly at the end portions of the wiring electrodes 141-149 disposed on the grooves 12d. When a metal film is formed by photolithography on a surface having projections and recessions, depth of focus during the exposure and reflection of light against the oblique surfaces can affect the film formation. For this reason, as compared to forming a film on a flat surface, it is difficult to achieve a predetermined film shape at the corners of the portions having projections and recessions and the bottom surfaces of the grooves 12d, resulting in forming protrusions. The protrusions might penetrate the second insulation layer 17 disposed on the upper surface side of the wiring electrodes 141-149, i.e., the protrusions might not be covered by the second insulation layer 17.

Likewise the protrusions are likely to be formed on the light reflective metal layer 151 formed in a similar manner to that used for the wiring electrodes 141-149. It is thus preferable to form the seed layers 18a while avoiding the end portions of the light reflective metal layer 151 disposed on the grooves 12d.

As a part of the layered structure of the light emitting element 1A, metal bumps 18p and 18n are provided on the wiring electrodes 141-149 via the second insulation layer 17. Furthermore, in this embodiment, the seed layers 18a, which are the lower layers of the metal bumps 18p and 18n, are disposed to extend in broad ranges of the upper surface of the second insulation layer 17.

Accordingly, if the seed layers 18a are formed to cover the end portions of the wiring electrodes 141-149 disposed on the grooves 12d, in particular, the protrusions could readily penetrate the second insulation layer 17, which might cause a short circuit between the wiring electrodes 141-149 and the seed layers 18a.

In this embodiment, the seed layers 18a are disposed to avoid the end portions of the wiring electrodes 141-149 disposed on the grooves 12d, and thus the likelihood of a short circuit between the seed layers 18a and the wiring electrodes 141-149 are reduced.

In this embodiment, in a top view, the seed layers 18a are provided in the areas not overlapped with the areas where the end portions of the light reflective metal layer 151 disposed on the grooves 12d are located. This thus also prevents the p-side and n-side seed layers 18a from shorting one another via the light reflective metal layer 151.

In the light emitting element 1 according to Embodiment 1, the light emitting cells 101-108 are arranged in upper and lower rows and connected by the wiring electrodes 141-149 in a zigzag pattern, whereas in the light emitting element 1A according to Embodiment 2, the light emitting cells 101-108 are arranged in left and right columns and linearly connected by the wiring electrodes 141-149. For this reason, the light emitting element 1A has a higher potential difference combination of the wiring electrodes arranged adjacent to one another among the wiring electrodes 141-149 than that of the light emitting element 1. For example, in the light emitting element 1, the potential difference between the wiring electrodes 141 and the 145, and the potential difference between the wiring electrodes 145 and 149 are the highest. Assuming that the potential difference per light emitting cell is 3V, for example, the highest potential difference would be 12V. In contrast, in the light emitting element 1A, the wiring electrodes 141 and 149 are arranged closest together, and the potential difference between these electrodes would be 24V. Accordingly, the arrangement of the wiring electrodes 141-149 of the light emitting element 1 is preferable from the perspective of preventing the migration of the electrode material.

The broad-range arrangement of the seed layers 18a in order to enhance the heat dissipation properties will be examined next. If the seed layers 18a of the light emitting element 1 were arranged in substantially the same ranges as those of the external connection electrodes 20p and 20n in a similar manner to those in the light emitting element 1A, the seed layers 18a would be disposed on the end portions of the wiring electrodes 141-149 located on the grooves 12d. For this reason, protrusions might be formed on the end portions of the wiring electrodes 141-149 and the end portions of the light reflective metal layers 151 and 153 disposed on the grooves 12d. It is likely for the protrusions to penetrate the second insulation layer 17 to cause a short circuit to the seed layers 18a. That is, in the case of arranging the seed layers 18a in a wide range for the purposes of enhancing the heat dissipation properties and reducing light leakage, the arrangement of the wiring electrodes 141-149 of the light emitting element 1A is preferable.

Accordingly, it is preferable to determine the arrangement of the light emitting cells, wiring electrodes, light reflective metal layers, and seed layers by taking into consideration the extent of reducing migration of electrode material migration, enhancing heat dissipation, reducing light leakage, and the unlikeliness of a short circuit between conductive members.

The light emitting elements according to the present invention have been specifically explained based on the embodiments above, but the spirit of the present invention should be broadly interpreted based on the scope of claims without limitation to those described above. It goes without saying that various changes and modifications made based on those described above also fall within the spirit and scope of the present invention.

The light emitting elements according to the embodiments of the present invention can be utilized as various light sources, such as for liquid crystal display backlights, lighting fixtures, and large displays.

What is claimed is:
1. A light emitting element comprising:
   a substrate;
   a plurality of semiconductor light emitting cells disposed on a upper surface side of the substrate;
   a plurality of light reflective electrodes disposed on each of upper surfaces of the plurality of semiconductor light emitting cells;
   a first insulation layer that continuously covers lateral surfaces of the semiconductor light emitting cells, spaces between the semiconductor light emitting cells, lateral surfaces of the light reflective electrodes, and a portion of upper surfaces of the light reflective electrodes;
   a plurality of wiring electrodes that electrically connect the plurality of semiconductor light emitting cells in series, and cover the lateral surfaces of the semiconductor light emitting cells and the spaces between the semiconductor light emitting cells via the first insulation layer; and
   a light reflective metal layer that covers the lateral surfaces of at least two adjacent ones of the semiconductor light emitting cells and the space between said at least two semiconductor light emitting cells, via the first insulation layer, wherein the light reflective metal layer is not electrically connected with said at least two adjacent ones of the semiconductor light emitting cells, wherein one or more portions of the light reflective metal layer cover one or more portions of the upper surfaces of the light reflective electrodes disposed on the upper surfaces of each of said at least two adjacent semiconductor light emitting cells, via the first insulation layer.

2. The light emitting element according to claim 1, wherein:
the semiconductor light emitting cells are arranged on the upper surface side of the substrate in two or more rows and two or more columns;
the wiring electrodes electrically connect the two or more semiconductor light emitting cells in each column, and electrically connect two of the semiconductor light emitting cells arranged at end portions of two adjacent columns on the same side; and
the light reflective metal layer continuously covers the lateral surfaces of four semiconductor light emitting cells arranged in two adjacent rows.

3. The light emitting element according to claim 2, wherein the light reflective electrodes include a metal layer made of Ag or an Ag alloy.

4. The light emitting element according to claim 3, wherein the wiring electrodes and the light reflective metal layer each include a metal layer made of Al or an Al alloy.

5. The light emitting element according to claim 4, wherein light emitted from the semiconductor light emitting cells is extracted from a lower surface of the substrate.

6. The light emitting element according to claim 3, wherein light emitted from the semiconductor light emitting cells is extracted from a lower surface of the substrate.

7. The light emitting element according to claim 3, further comprising:
a second insulation layer covering the wiring electrodes, the light reflective metal layer, and the first insulation layer; and
one or more additional metal layers electrically connected to the wiring electrodes, each covering a portion of the second insulation layer,
wherein the one or more additional metal layers cover at least areas at which the light reflective electrodes, the wiring electrodes, and the light reflective metal layer are not disposed, in a top view.

8. The light emitting element according to claim 7, wherein the one or more additional metal layers are disposed in contact with the second insulation layer, and include a metal layer made of Al, Ag, an Al alloy or an Ag alloy.

9. The light emitting element according to claim 8, further comprising,
a plated layer disposed on each of upper surfaces of the one or more additional metal layers,
wherein each of the one or more additional metal layers is disposed on an area wider than that of the plated layer, in a top view.

10. The light emitting element according to claim 2, wherein the wiring electrodes and the light reflective metal layer each include a metal layer made of Al or an Al alloy.

11. The light emitting element according to claim 2, wherein light emitted from the semiconductor light emitting cells is extracted from a lower surface of the substrate.

12. The light emitting element according to claim 2, further comprising:
a second insulation layer covering the wiring electrodes, the light reflective metal layer, and the first insulation layer; and
one or more additional metal layers electrically connected to the wiring electrodes, each covering a portion of the second insulation layer,
wherein the one or more additional metal layers cover at least areas at which the light reflective electrodes, the wiring electrodes, and the light reflective metal layer are not disposed, in a top view.

13. The light emitting element according to claim 12, wherein the one or more additional metal layers are disposed in contact with the second insulation layer, and include a metal layer made of Al, Ag, an Al alloy or an Ag alloy.

14. The light emitting element according to claim 13, further comprising,
a plated layer disposed on each of upper surfaces of the one or more additional metal layers,
wherein each of the one or more additional metal layers is disposed on an area wider than that of the plated layer, in a top view.

15. The light emitting element according to claim 1, wherein the light reflective electrodes include a metal layer made of Ag or an Ag alloy.

16. The light emitting element according to claim 1, wherein the wiring electrodes and the light reflective metal layer each include a metal layer made of Al or an Al alloy.

17. The light emitting element according to claim 1, wherein light emitted from the semiconductor light emitting cells is extracted from a lower surface of the substrate.

18. The light emitting element according to claim 1, further comprising:
a second insulation layer covering the wiring electrodes, the light reflective metal layer, and the first insulation layer; and
one or more additional metal layers electrically connected to the wiring electrodes, each covering a portion of the second insulation layer,
wherein the one or more additional metal layers cover at least areas at which the light reflective electrodes, the wiring electrodes, and the light reflective metal layer are not disposed, in a top view.

19. The light emitting element according to claim 18, wherein the one or more additional metal layers are disposed in contact with the second insulation layer, and include a metal layer made of Al, Ag, an Al alloy or an Ag alloy.

20. The light emitting element according to claim 19, further comprising,
a plated layer disposed on each of upper surfaces of the one or more additional metal layers,
wherein each of the one or more additional metal layers is disposed on an area wider than that of the plated layer, in a top view.

* * * * *